US011428652B2

(12) United States Patent
Irie et al.

(10) Patent No.: US 11,428,652 B2
(45) Date of Patent: Aug. 30, 2022

(54) PATTERN EVALUATION SYSTEM AND PATTERN EVALUATION METHOD

(71) Applicant: Hitachi High-Tech Corporation, Tokyo (JP)

(72) Inventors: Koichiro Irie, Minato-ku (JP); Ayumi Doi, Minato-ku (JP); Tianming Li, Minato-ku (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 16/853,306

(22) Filed: Apr. 20, 2020

(65) Prior Publication Data
US 2020/0363350 A1    Nov. 19, 2020

(30) Foreign Application Priority Data
May 13, 2019    (JP) .............................. JP2019-090344

(51) Int. Cl.
*G01N 23/2251*    (2018.01)
*H01J 37/26*    (2006.01)

(52) U.S. Cl.
CPC ........ *G01N 23/2251* (2013.01); *H01J 37/265* (2013.01); *H01J 2237/24592* (2013.01)

(58) Field of Classification Search
CPC .. H01J 37/00; H01J 37/02; H01J 37/22; H01J 37/26; H01J 37/265; H01J 37/28;
(Continued)

(56) References Cited

U.S. PATENT DOCUMENTS 6,326,618 B1 *  12/2001  Kane ...................... G01B 15/04
                                                      250/307
6,727,501 B1 *   4/2004  Fan ..................... G01N 23/2251
                                                      250/307
(Continued)

FOREIGN PATENT DOCUMENTS

JP           8-222175 A      8/1996
JP        2010-249587 A     11/2010
(Continued)

OTHER PUBLICATIONS

Taiwanese language Office Action issued in Taiwanese Application No. 109115173 dated Mar. 9, 2021 (six (6) pages).
(Continued)

*Primary Examiner* — Jason L McCormack
(74) *Attorney, Agent, or Firm* — Crowell & Moring LLP

(57) ABSTRACT

Provided is a technology for evaluating a property of a pattern formed inside a sample from two-dimensional information of the sample. A pattern evaluation system of the present disclosure includes a computer subsystem that executes a process of evaluating a property of a pattern by reading a program from a memory that stores the program for evaluating the property of the pattern formed inside a sample. The computer subsystem executes a process of acquiring an image of the sample; a process of extracting a signal waveform from the image; a process of calculating a feature amount in a predetermined region of the signal waveform; a process of comparing the feature amount with a reference value of the feature amount; and a process of evaluating the property of the pattern based upon a comparison result in the comparison process.

18 Claims, 17 Drawing Sheets

(58) Field of Classification Search
CPC .................... H01J 37/12; H01J 37/222; H01J 2237/24592; H01J 2237/2817; H01J 2237/2814; H01J 22/12; G03F 7/70625
USPC ............................... 250/306, 307, 310, 311
See application file for complete search history.

(56) References Cited

U.S. PATENT DOCUMENTS

| | | | |
|---|---|---|---|
| 8,841,614 B1* | 9/2014 | Murakami | H01J 37/222 250/311 |
| 2012/0037801 A1 | 2/2012 | Mochizuki et al. | |
| 2013/0120551 A1* | 5/2013 | Yamada | H04N 7/18 348/80 |
| 2013/0316492 A1 | 11/2013 | Ushifusa et al. | |
| 2014/0312225 A1 | 10/2014 | Murakawa et al. | |
| 2015/0285627 A1* | 10/2015 | Yamaguchi | G03F 7/70633 702/150 |
| 2018/0182595 A1* | 6/2018 | Yokosuka | G03F 7/70625 |
| 2019/0066973 A1 | 2/2019 | Kawada et al. | |
| 2019/0103250 A1* | 4/2019 | Yokosuka | H01J 37/265 |
| 2019/0371568 A1* | 12/2019 | Fukuda | G01B 15/04 |
| 2021/0027983 A1* | 1/2021 | Nishihata | G01N 23/2251 |

FOREIGN PATENT DOCUMENTS

| | | |
|---|---|---|
| JP | 2012-173028 A | 9/2012 |
| JP | 2014-4819 A | 1/2014 |
| JP | 6084888 B2 | 2/2017 |
| TO | 201913230 A | 4/2019 |

OTHER PUBLICATIONS

Korean language Office Action issued in Korean Application No. 10-2020-0031758 dated Mar. 22, 2021 with English translation (five (5) pages).

* cited by examiner

[FIG. 1]
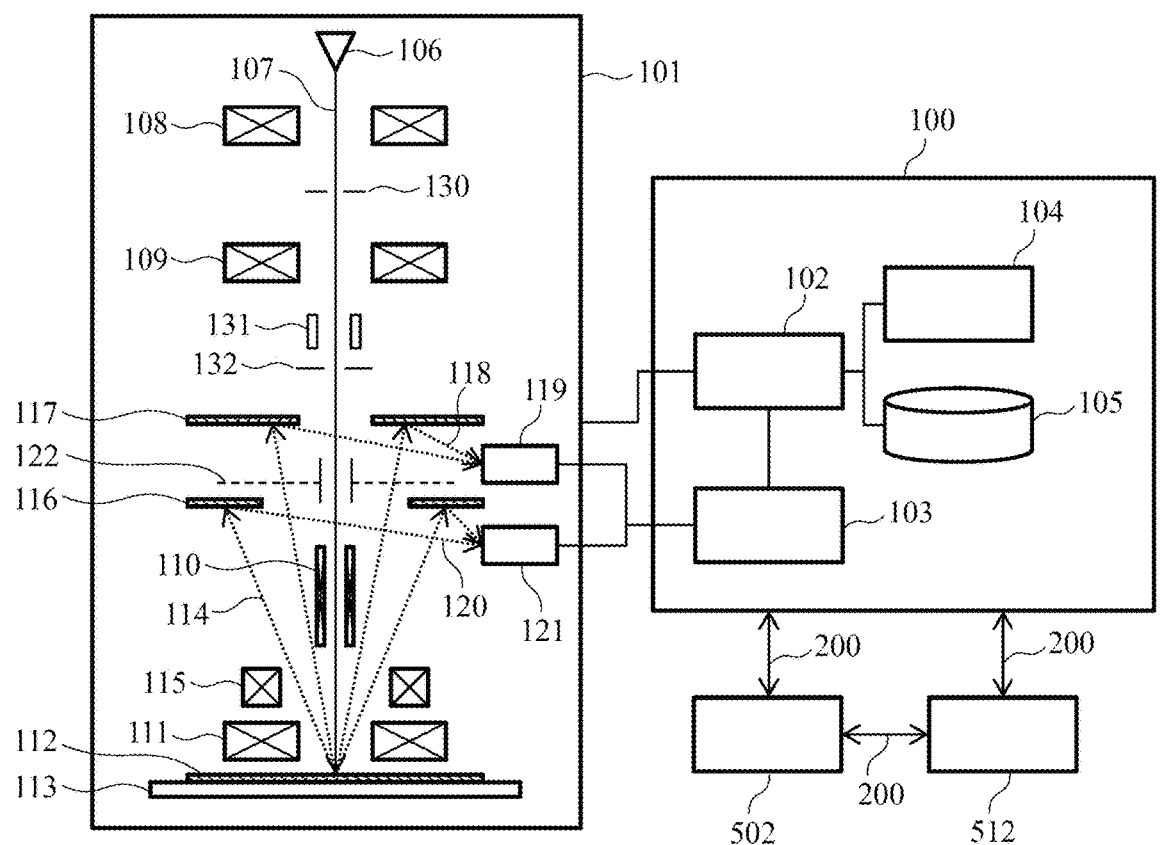

[FIG. 2]
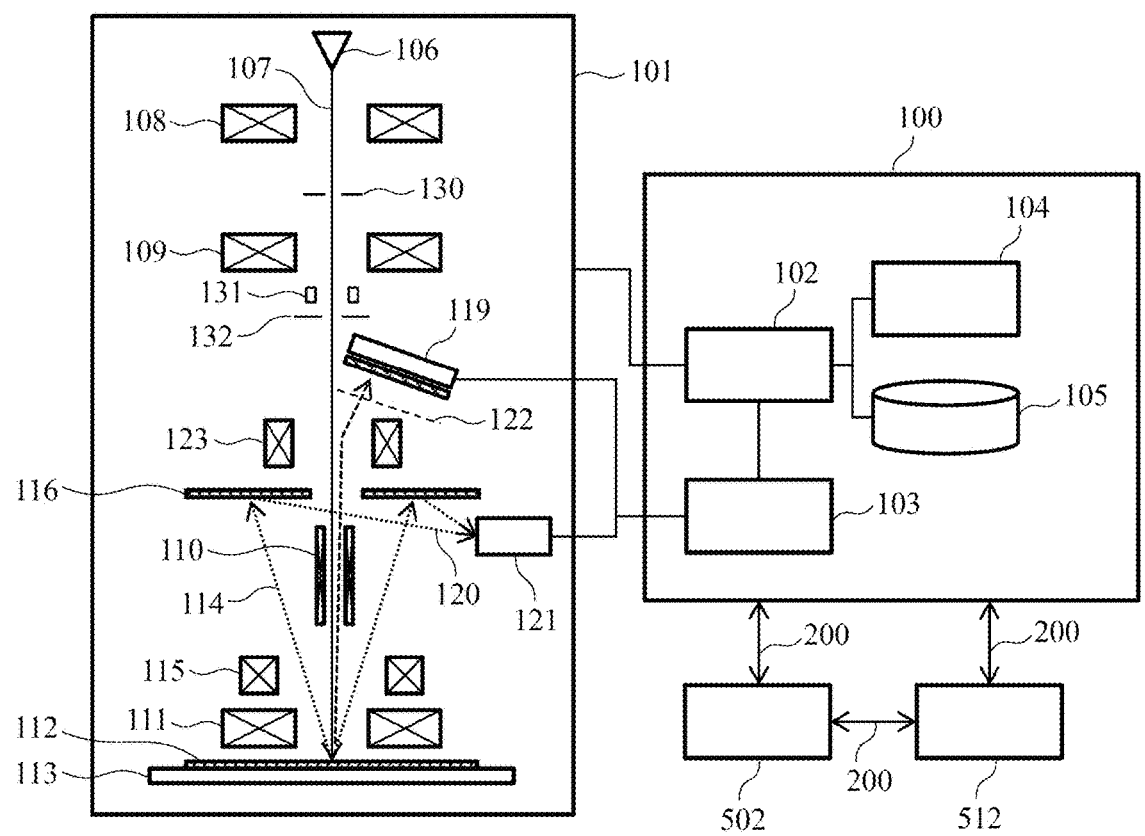

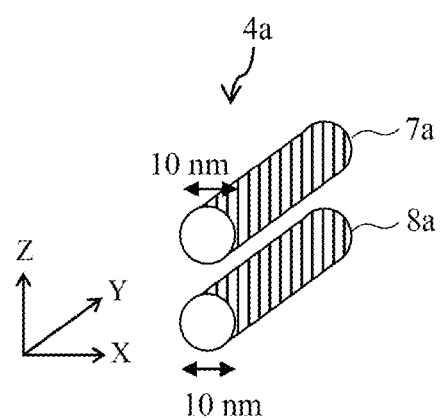 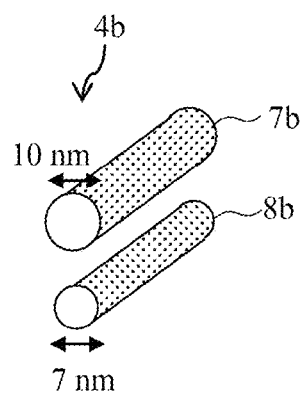 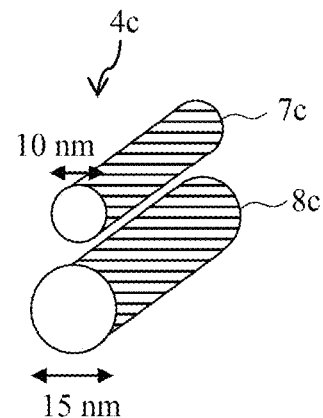
FIG. 4A          FIG. 4B          FIG. 4C
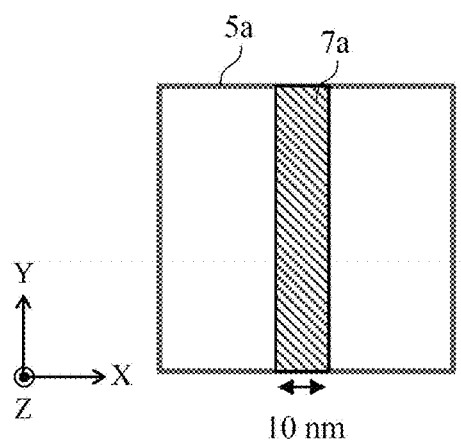 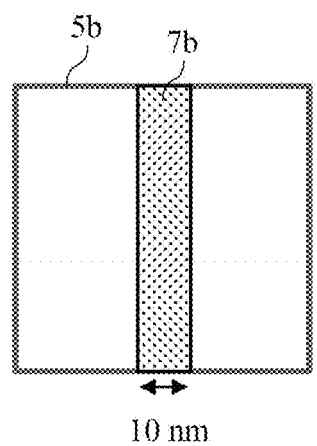 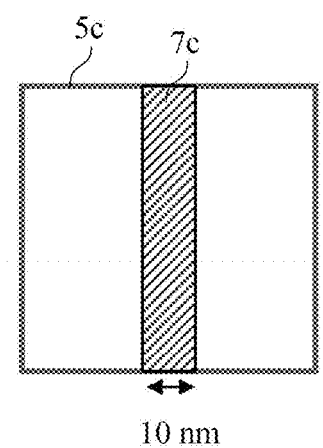
FIG. 5A          FIG. 5B          FIG. 5C

[FIG. 6]
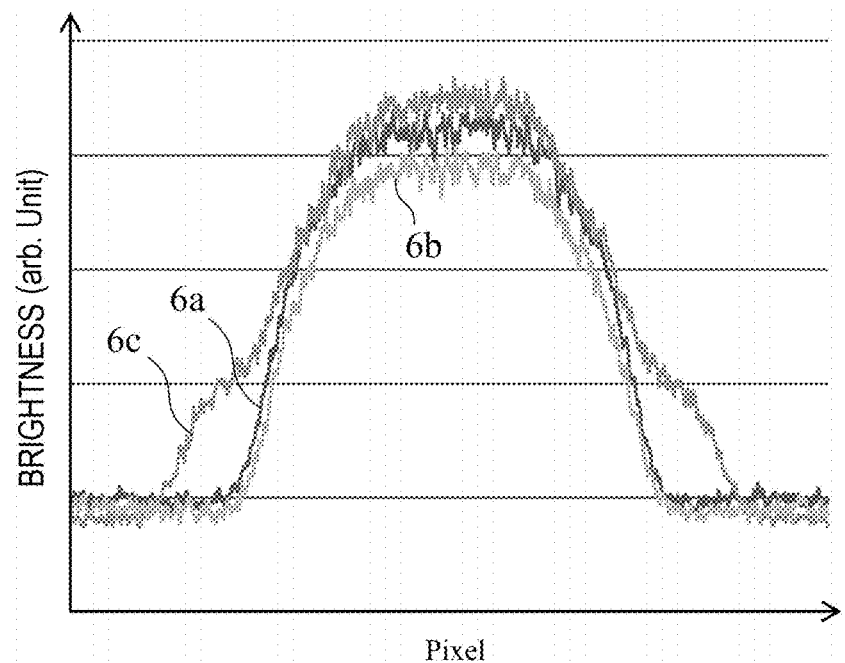
[FIG. 7]
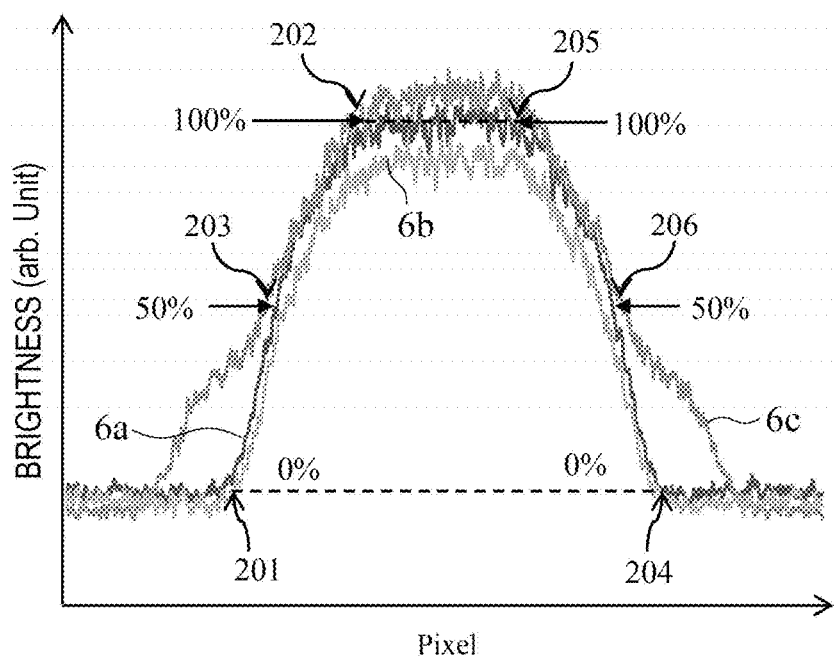

FIG. 8A  FIG. 8B
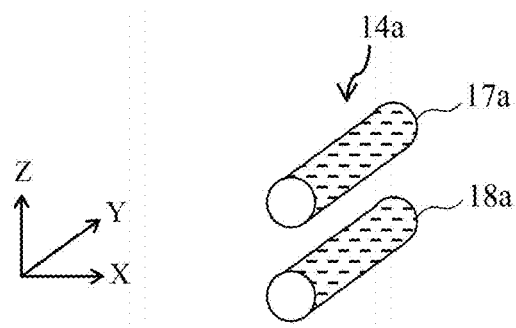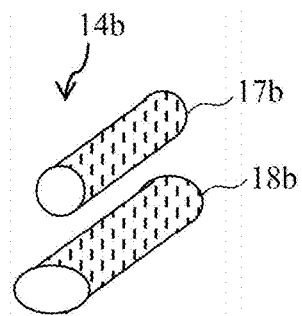
FIG. 8C
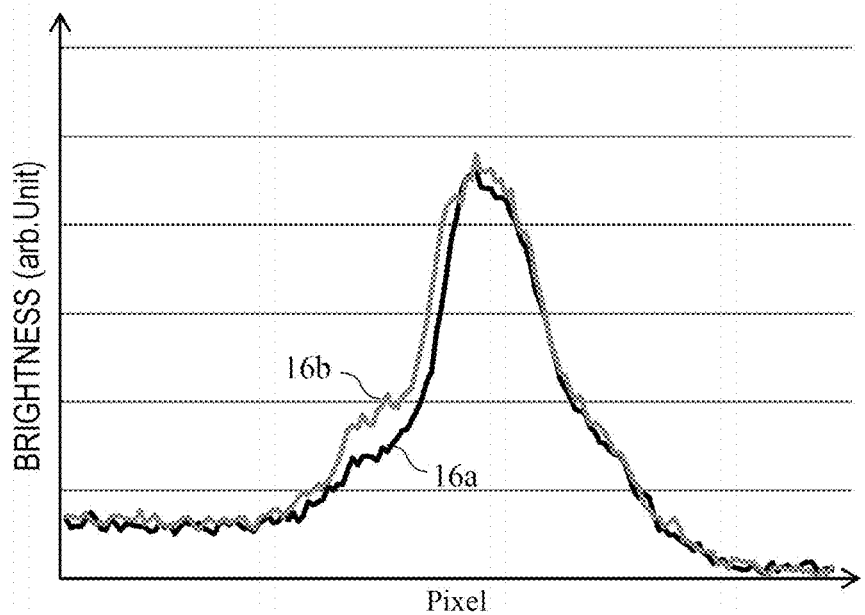

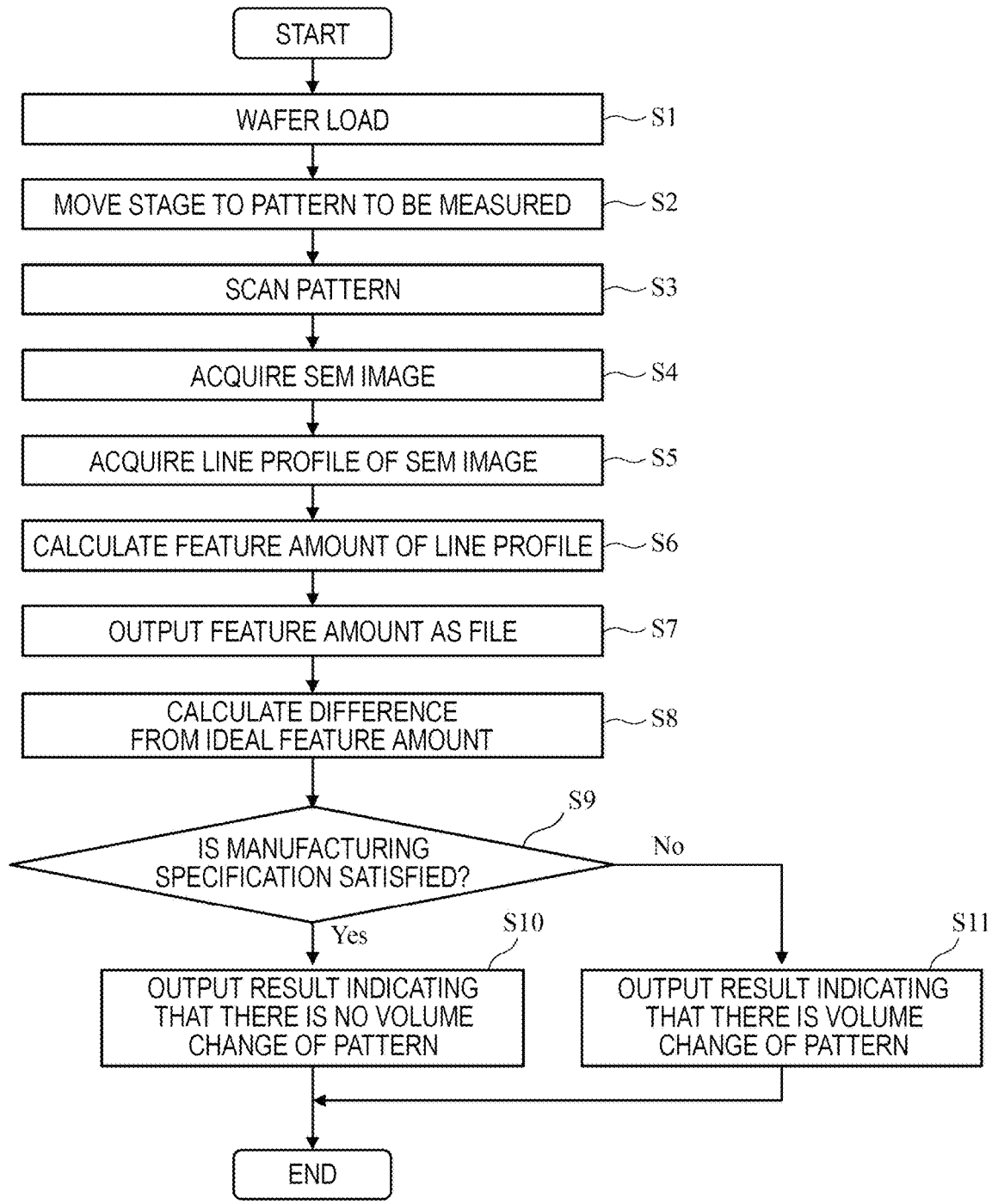
[FIG. 9]

MEASUREMENT DATA LIST FILE

IMAGE OPERATION SCREEN

SELECTION SCREEN

MAP SCREEN

TAB

HISTOGRAM SCREEN

[FIG. 12]
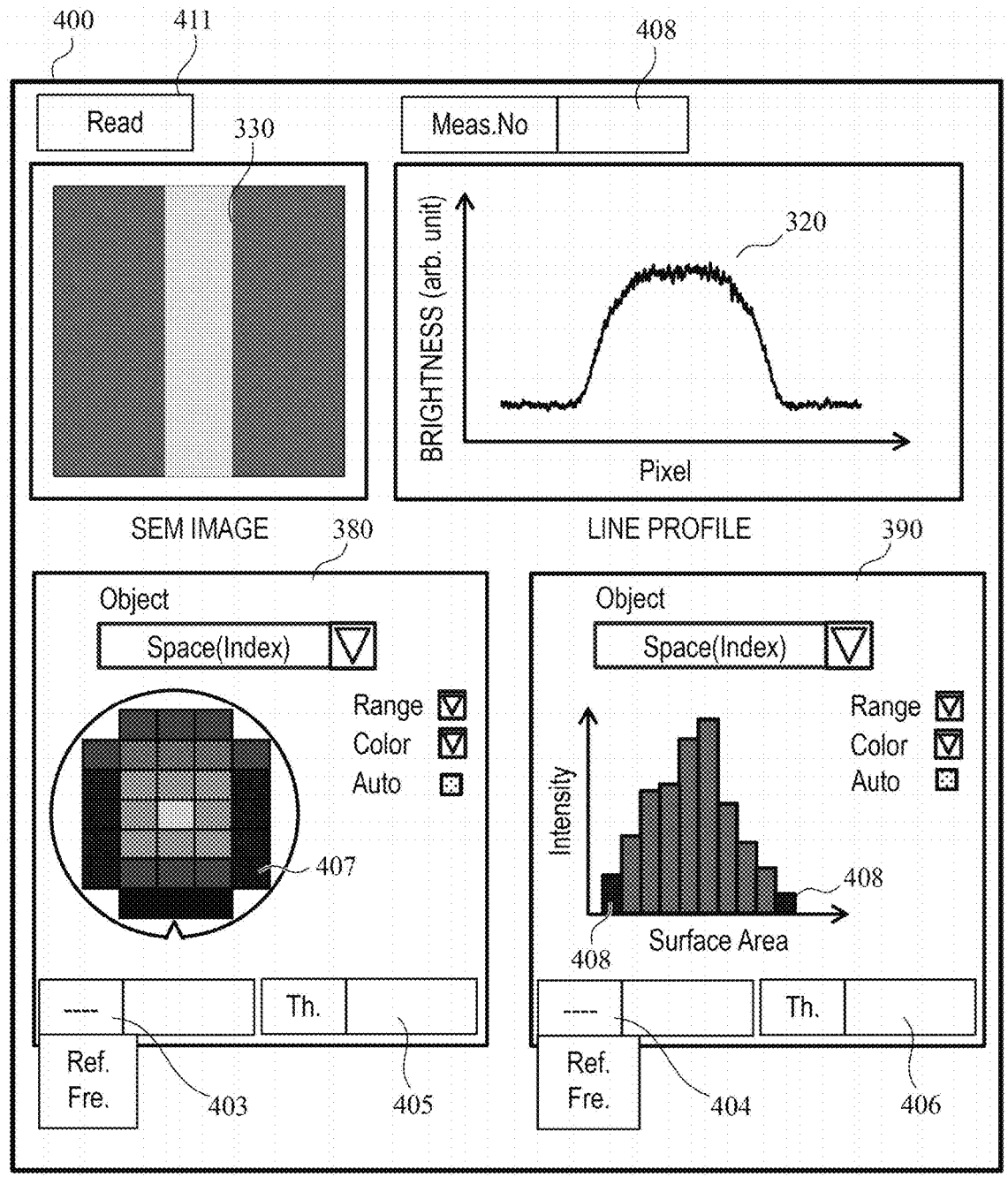

[FIG. 13]
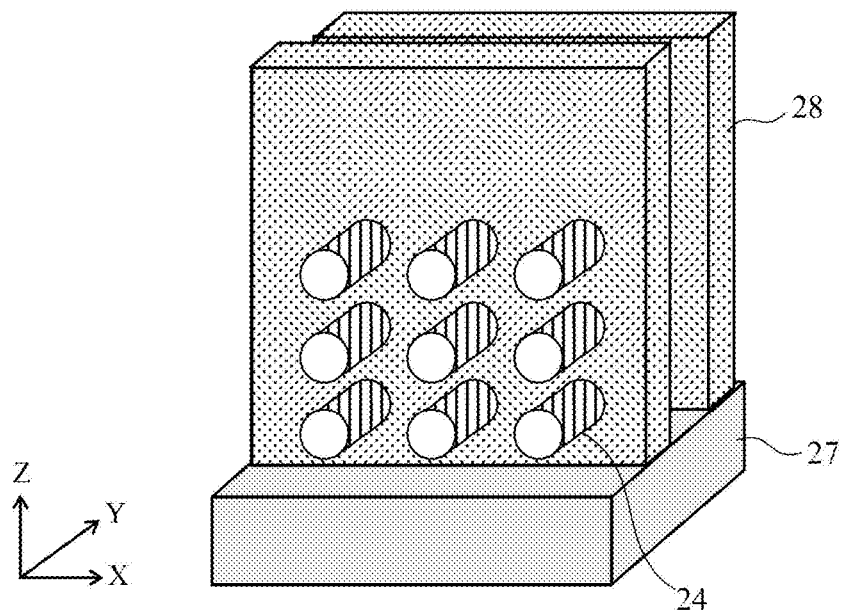

[FIG. 14]
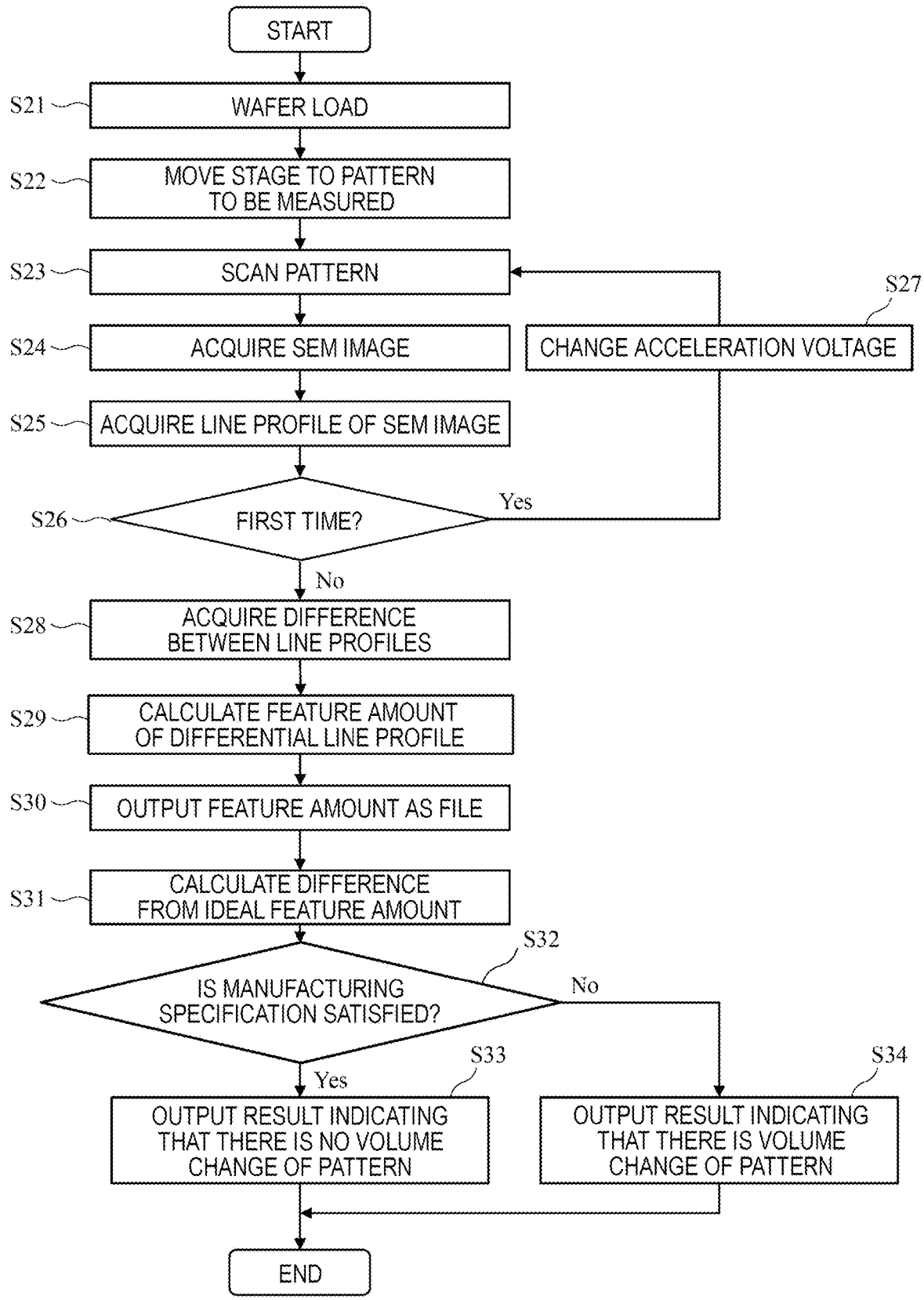

[FIG. 15]

SEM Condition SCREEN

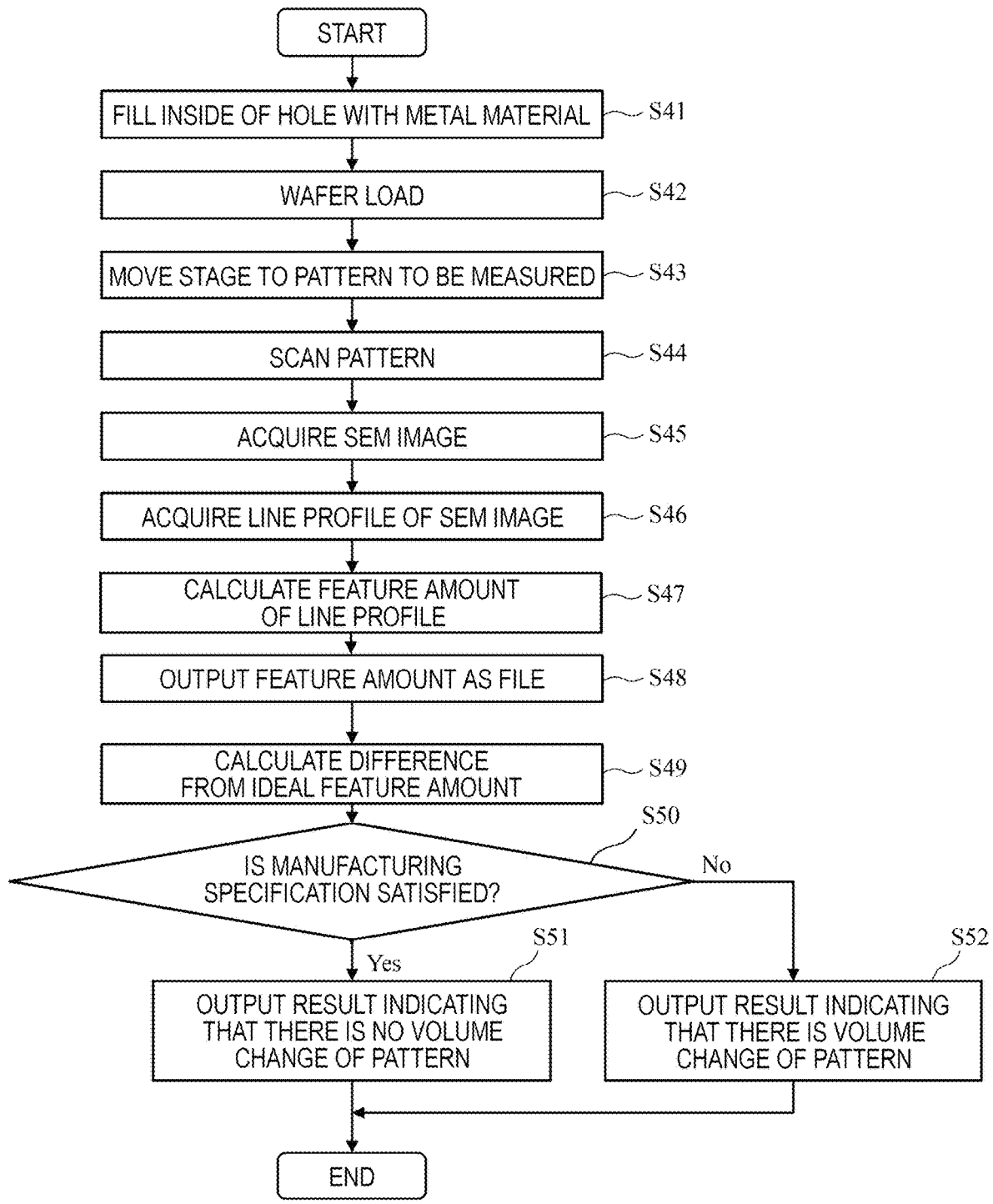
[FIG. 18]

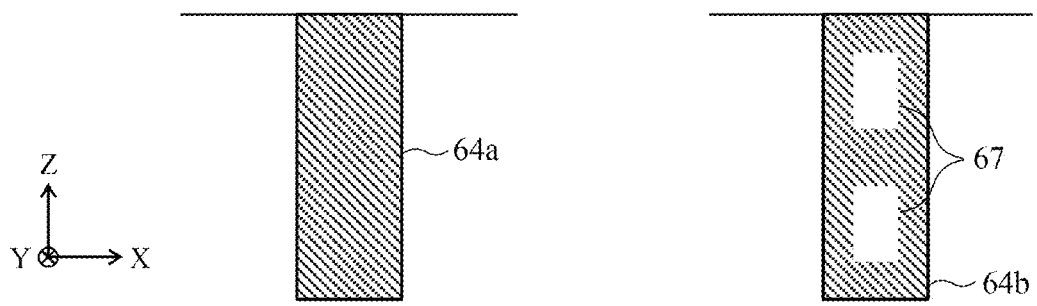
FIG. 20A  FIG. 20B
[FIG. 21]
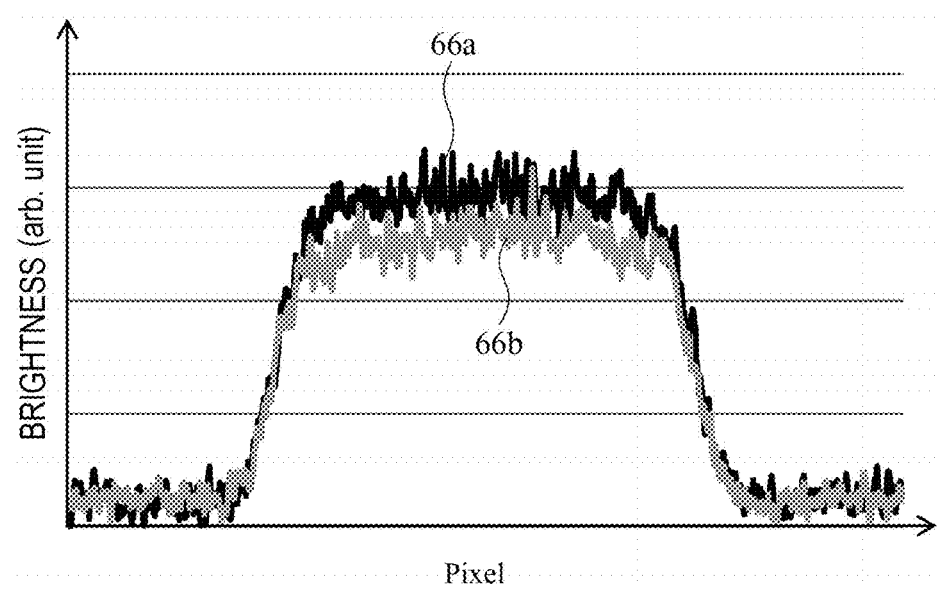

PATTERN EVALUATION SYSTEM AND PATTERN EVALUATION METHOD

TECHNICAL FIELD

The present disclosure relates to a pattern evaluation system and a pattern evaluation method.

BACKGROUND ART

In order to manage a manufacturing process of a semiconductor product, it is required to measure a dimension of a pattern formed on a semiconductor substrate, to monitor manufacturing variations of the pattern and defect occurrence thereof, and to improve a production yield. As a device for measuring the dimension of the pattern in the semiconductor product, for example, a critical dimension-scanning electron microscope (CD-SEM) is used.

Patent Literature 1 discloses that in a defect inspection device (scanning electron microscope) that inspects a defect of a sample surface, when a difference image is generated by obtaining a difference between image data in two directions opposite to each other with an optical axis of an electron beam interposed therebetween, and unevenness on the sample surface is detected based upon a brightness value of the difference image, a difference profile is obtained for each of a defective part including the unevenness in the difference image and a background part where the unevenness is not detected, and an integration profile is obtained by subtracting an integral profile obtained by integrating the difference profile of the background part from an integral profile obtained by integrating the difference profile of the defective part (refer to claim 1 of Patent Literature 1).

CITATION LIST

Patent Literature

Patent Literature 1: U.S. Pat. No. 6,084,888

SUMMARY OF INVENTION

Technical Problem

In recent years, as a pattern of a semiconductor product becomes three-dimensional, there is an increasing need to manage a manufacturing process by measuring a plurality of three-dimensional patterns having the same shapes arranged in a depth direction by using a length measurement SEM.

However, in the defect inspection device described in Patent Literature 1, even though the pattern of the sample surface can be measured, there is no description about managing the manufacturing process by measuring the pattern formed inside the sample, and thus it is not possible to measure and evaluate a volume change of the internal pattern.

Therefore, the present disclosure provides a technology for evaluating a property of the pattern formed inside the sample from two-dimensional information of the sample.

Solution to Problem

A pattern evaluation system of the present disclosure includes a computer subsystem that executes a process of evaluating a property of a pattern by reading a program from a memory that stores the program for evaluating the property of the pattern formed inside a sample. The computer subsystem executes a process of acquiring an image of the sample; a process of extracting a signal waveform from the image; a process of calculating a feature amount in a predetermined region of the signal waveform; a process of comparing the feature amount with a reference value of the feature amount; and a process of evaluating the property of the pattern based upon a comparison result in the comparison process.

Further features related to the present disclosure will be apparent from the descriptions and accompanying drawings of this specification. An aspect of the present disclosure is achieved and realized by an element, a combination of various elements, the following detailed descriptions, and an aspect of the scope of the appended claims. The descriptions in the specification are merely provided for a typical example, and is not intended to limit the scope or the application of the claims of the present disclosure in any way.

Advantageous Effects of Invention

According to the present disclosure, it is possible to evaluate a property of a pattern formed inside a sample from two-dimensional information of the sample.

A problem, a configuration, and an effect not described hereinabove will be clarified by the descriptions of following embodiments.

BRIEF DESCRIPTION OF DRAWINGS

FIG. 1 is a schematic configuration diagram illustrating an example of a pattern evaluation system according to a first embodiment.

FIG. 2 is a schematic configuration diagram illustrating an example of a pattern evaluation system according to the first embodiment.

FIGS. 4A to 4C are cross-sectional perspective views illustrating an example of a pattern to be measured according to the first embodiment.

FIGS. 5A to 5C are schematic diagrams illustrating an SEM image in which the pattern illustrated in FIGS. 4A to 4C is observed from above.

FIG. 6 is a diagram illustrating a line profile obtained by integrating a brightness value of the SEM image illustrated in FIGS. 5A to 5C in a Y direction.

FIG. 7 is a diagram illustrating a method of calculating a pattern dimension from the line profile of the brightness value.

FIGS. 8A to 8C are cross-sectional perspective views and a line profile of a pattern according to the first embodiment.

FIG. 9 is a flowchart illustrating an example of a pattern evaluation method according to the first embodiment.

FIG. 12 is a schematic diagram illustrating a GUI screen for managing the measurement data.

FIG. 13 is a cross-sectional perspective view illustrating a sample according to a second embodiment.

FIG. 14 is a flowchart illustrating an example of a pattern evaluation method according to the second embodiment.

FIG. 15 is a schematic diagram illustrating a GUI screen for setting an acceleration voltage.

FIG. 18 is a flowchart illustrating an example of a pattern evaluation method according to the fourth embodiment.

FIGS. 20A and 20B are cross-sectional views illustrating an example of a columnar pattern to be measured according to a sixth embodiment.

FIG. 21 is a diagram illustrating a line profile calculated by a simulation with respect to the columnar pattern according to the sixth embodiment.

DESCRIPTION OF EMBODIMENTS

First Embodiment

Figure 3A:
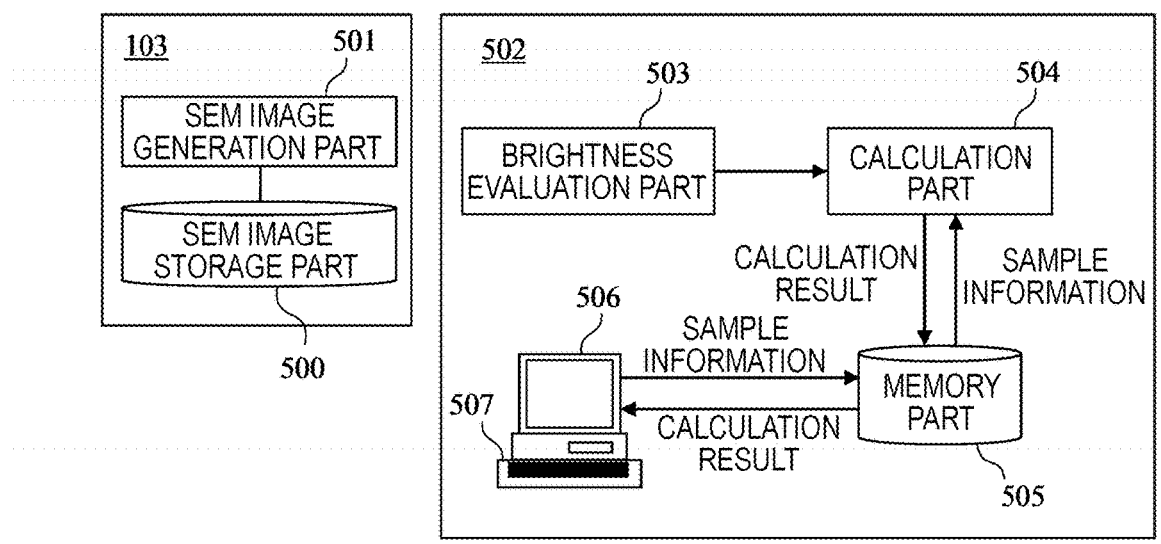
FIGS. 3A and 3B are functional block diagrams of a signal processing part and a computer subsystem according to the first embodiment.

[Configuration of Pattern Evaluation System]FIG. 1 is a schematic configuration diagram illustrating an example of a pattern evaluation system according to a first embodiment. As illustrated in FIG. 1, a pattern evaluation system 1 includes a computer subsystem 100, a charged particle beam emission subsystem 101, a computer subsystem 502, and a computer subsystem 512.

The charged particle beam emission subsystem 101 (imaging tool) is, for example, a lens barrel part including an optical element of a scanning electron microscope, and includes an electron gun 106, focusing lenses 108 and 109, a deflector 110, an objective lens 111, a stage 113, a deflector 115, a detection aperture 116, a reflection plate 117, detectors 119 and 121, a shutter 130, a blanking deflector 131, and a blanking electrode 132. The focusing lens 108 focuses an electron beam 107 (charged particle beam) emitted from the electron gun 106, and the focusing lens 109 further focuses the electron beam 107 passing through the focusing lens 108. The deflector 110 deflects the electron beam 107, and the objective lens 111 controls a height at which the electron beam 107 is focused.

The electron beam 107 passing through the optical element of the charged particle beam emission subsystem 101 as described above is emitted to a sample 112 mounted on the stage 113. The sample 112 is, for example, a semiconductor product in which a plurality of layers having a pattern of a predetermined shape are stacked on a wafer.

An emitted electron 114 (secondary electron (SE), backscattered electron (BSE), or the like) emitted from the sample 112 by the emission of the electron beam 107 are guided in a predetermined direction by the deflector 115 (secondary electron aligner). The deflector 115 may be a so-called Wien filter, and may selectively deflect the emitted electron 114 in a predetermined direction without deflecting the electron beam 107.

The detection aperture 116 performs angle discrimination of the emitted electron 114 and causes the emitted electron 114 to collide with the reflection plate 117. A tertiary electron 118 (secondary electron of the emitted electron 114) emitted from the reflection plate 117 is guided to the detector 119 by the Wien filter (not illustrated). The detector 121 detects a tertiary electron 120 (secondary electron of the emitted electron 114) generated by the collision of the emitted electron 114 with the detection aperture 116.

The reflection plate 117 includes an opening through which the electron beam 107 emitted from the electron gun 106 passes, and causes the opening to be sufficiently small, thereby making it possible to selectively detect the emitted electron 114 emitted vertically upward from a hole bottom or a groove bottom of a pattern formed in the sample 112. On the other hand, the emitted electron 114 can be deflected by the deflector 115, thereby making it possible for the emitted electron 114 emitted vertically upward not to pass through the opening of the reflection plate 117. The energy of the emitted electron 114 emitted vertically upward can be selected by an energy filter 122 provided between the reflection plate 117 and the detection aperture 116.

The shutter 130 partially limits the passage of the electron beam 107. The blanking deflector 131 limits the arrival of the electron beam 107 to the sample 112 by deflecting the electron beam 107 to the outside of the optical axis. The blanking electrode 132 receives the electron beam 107 deflected by the blanking deflector 131.

The computer subsystem 100 is a computer system that controls an operation of the charged particle beam emission subsystem 101, and includes an overall control part 102, a signal processing part 103, an input and output part 104, and a memory part 105.

The overall control part 102 and the signal processing part 103 can be configured by a processor such as a CPU and an MPU. The overall control part 102 controls the optical element provided in the charged particle beam emission subsystem 101, thereby executing processing required for imaging the sample 112.

The signal processing part 103 generates an SEM image of the sample 112 based upon the output of detection signals from the detectors 119 and 121. The signal processing part 103 generates image data by storing the detection signal in a frame memory in synchronization with scanning of a scanning deflector which is not illustrated. When storing the detection signal in the frame memory, a signal profile (one-dimensional information) and an SEM image (two-dimensional information) are generated by storing the detection signal at a position corresponding to a scanning position of the frame memory. The scanning by the scanning deflector can be performed in any size, position, and direction.

Although not illustrated herein, the input and output part 104 includes: an input device for allowing a user to input design data (sample information) such as a design dimension of the pattern and a manufacturing condition thereof, and an instruction to start an operation of the charged particle beam emission subsystem 101; and a display device that displays a GUI screen for inputting the design data and the instruction, and the SEM image generated by the signal processing part 103. The input device may be any device such as a mouse, a keyboard, and a voice input device as long as the user can input data and instructions. The display device is, for example, a display device. The input and output part 104 may be a touch panel capable of inputting and displaying the data.

The memory part 105 stores various pieces of data necessary for imaging processing such as a program for executing the imaging processing by driving the optical element of the charged particle beam emission subsystem 101 by the overall control part 102, the design data of the pattern, and position information of an observation place (sample information).

The computer subsystem 100 is connected to the computer subsystem 502 and the computer subsystem 512 by, for example, a network 200. The computer subsystems 502 and 512 are also connected to each other by, for example, the network 200. The computer subsystems 100, 502, and 512 are configured to be able to transmit and receive data and signals to and from each other.

The details of the computer subsystems 502 and 512 will be described later, and the computer subsystem 502 executes processing for measuring the dimension of the pattern formed in the sample 112 and evaluating a property thereof, based upon the SEM image generated by the signal processing part 103.

The computer subsystem 512 is, for example, a simulator, generates an SEM image of an ideal pattern and a line profile of the brightness value based upon the design data of the pattern, and calculates a reference value to be referred to in the property evaluation of the pattern by the computer subsystem 502. In the specification, the "ideal pattern" indicates a pattern whose properties such as a dimension, a shape, a volume, and a density are within a range of the design data±a predetermined error value. The predetermined error value is, for example, a value that can be allowed as a manufacturing variation of the semiconductor product, and can be appropriately set by a user.

FIG. 2 is a schematic configuration diagram illustrating another pattern evaluation system 2 according to the first embodiment. The pattern evaluation system 1 and the pattern evaluation system 2 are only partially different in the configuration of the charged particle beam emission subsystem 101, and any configuration may be adopted in the embodiment.

As illustrated in FIG. 2, in the pattern evaluation system 2, the detector 119 is disposed outside an emission axis of the electron beam 107, and includes a detection surface at a position where the emitted electron 114 (emitted particle) collides. A deflector 123 (secondary electron aligner) for guiding the emitted electron 114 to the detector 119 is provided.

The emitted electron 114 incident on the detection surface of the detector 119 is converted into an optical signal by, for example, a scintillator (not illustrated) provided on the detection surface. This optical signal is amplified by an amplifier such as a photomultiplier and converted into an electric signal, and then is inputted to the signal processing part 103 as an output of the detector 119. The energy filter 122 is provided immediately before the detector 119, such that the emitted electron 114 having a passing orbit near the optical axis can be energy-discriminated.

FIG. 3A is a functional block diagram of the signal processing part 103 and the computer subsystem 502. As illustrated in FIG. 3A, the signal processing part 103 includes an SEM image generation part 501 and an SEM image storage part 500. The SEM image generation part 501 receives the detection signals outputted from the detectors 119 and 121 of the charged particle beam emission subsystem 101, and generates the SEM image. The SEM image storage part 500 includes, for example, the frame memory, and stores the SEM image generated by the SEM image generation part 501. The SEM image generation part 501 outputs the generated SEM image to the computer subsystem 502.

The computer subsystem 502 includes a brightness evaluation part 503, a calculation part 504, a memory part 505, a display part 506, and an input part 507. The brightness evaluation part 503 and the calculation part 504 can be configured by a processor such as a CPU and an MPU.

The brightness evaluation part 503 receives the SEM image from the SEM image generation part 501, acquires a line profile (signal waveform) of the brightness value, and outputs the acquired line profile to the calculation part 504.

The calculation part 504 calculates a dimension value of the pattern formed in the sample 112 based upon the line profile received from the brightness evaluation part 503. As described later, the calculation part 504 calculates a feature amount at a peak (predetermined region) of the line profile, and compares the calculated feature amount with a feature amount of a reference line profile serving as a reference value in the property evaluation of the pattern.

The memory part 505 stores a program for performing the above-described processing in the brightness evaluation part 503 and the calculation part 504, and stores a calculation result by the calculation part 504.

The display part 506 displays the calculation result by the calculation part 504 and various GUI screens. The input part 507 is, for example, an input device such as a keyboard and a mouse, and is used by a user to input various pieces of data such as sample information from a GUI screen displayed on the display part 506. Instead of providing the input part 507, for example, the display part 506 may be used as a touch panel.

Figure 3B:
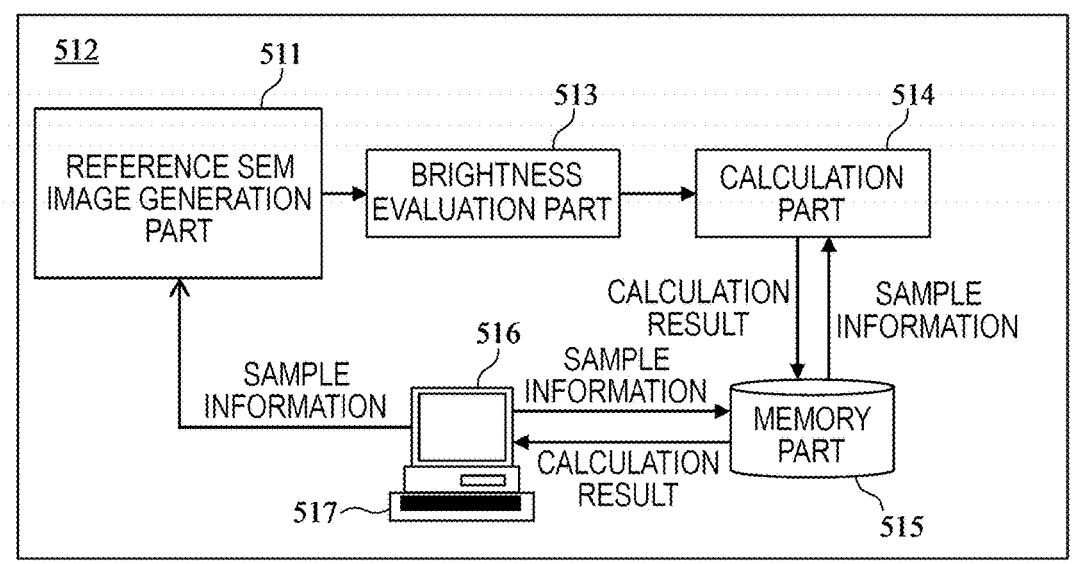

FIG. 3B is a functional block diagram of the computer subsystem 512. As illustrated in FIG. 3B, the computer subsystem 512 includes a reference SEM image generation part 511, a brightness evaluation part 513, a calculation part 514, a memory part 515, a display part 516, and an input part 517. The brightness evaluation part 513 and the calculation part 514 can be configured by a processor such as a CPU and an MPU.

The reference SEM image generation part 511 generates a reference SEM image which is the SEM image of the ideal pattern, and outputs the reference SEM image to the brightness evaluation part 513. The reference SEM image can be generated by, for example, a simulation using the design data (sample information) of the pattern inputted from the input part 517 by the user. Alternatively, the reference SEM image generation part 511 may receive the SEM images at a plurality of measurement points from the SEM image generation part 501 of the signal processing part 103, and may set the SEM image closest to the ideal pattern among the SEM images as the reference SEM image.

The brightness evaluation part 513 acquires a reference line profile (reference signal waveform) which is a line profile of the brightness value of the reference SEM image.

The calculation part 514 calculates a feature amount at the peak of the reference line profile, and outputs the calculated feature amount to the calculation part 504 of the computer subsystem 502. The feature amount of the reference line profile becomes the reference value in the pattern property evaluation by the computer subsystem 502. In the specification, the "feature amount of the reference line profile" may be simply referred to as the "reference value".

The memory part 515 stores a program for performing the above-described processing in the brightness evaluation part 513 and the calculation part 514, and stores a calculation result of the calculation part 514.

The display part 516 displays the calculation result of the calculation part 514 and various GUI screens. The input part 517 is, for example, an input device such as a keyboard and a mouse, and is used by a user to input various pieces of data such as sample information from a GUI screen displayed on the display part 516. Instead of providing the input part 517, for example, the display part 516 may be used as a touch panel.

The computer subsystems 502 and 512 may be respectively configured with a plurality of computer subsystems.

In this case, the computer subsystem includes one or more components executed by the computer subsystems 502 and 512.

In the embodiment, an example in which the computer subsystems 502 and 512 respectively have separate systems is described, but each function of the computer subsystems 502 and 512 can be configured to be executed by one computer subsystem.

Each function of the computer subsystems 502 and 512 can be incorporated in the signal processing part 103, thereby serving as a module of the charged particle beam emission subsystem 101. In this case, the signal processing part 103 includes the SEM image storage part 500, the SEM image generation part 501, the brightness evaluation part 503, the calculation part 504, the reference SEM image generation part 511, the brightness evaluation part 513, and the calculation part 514. The memory parts 505 and 515 may be the memory part 105 of the computer subsystem 100, and the display part 506 and the input part 507, and the display part 516 and the input part 517 may be the input and output part 104 of the computer subsystem 100.

In the embodiment, an example in which the charged particle beam emission subsystem 101 is the scanning electron microscope is described, but the present disclosure is not limited thereto, and another charged particle beam device (charged particle beam emission subsystem) such as a focused ion beam device may be used as the charged particle beam emission subsystem 101.

[Pattern Evaluation Method]

When observing a pattern shape on the sample surface, a length measurement SEM used for mass production management of the semiconductor product (sample) causes the electron beam to be incident on the pattern at a low acceleration voltage, extracts the line profile of the brightness value of the pattern from the detection signal such as the secondary electron or the backscattered electron obtained from near the surface of the pattern, and measures the dimension based upon the line profile.

For example, when a plurality of layers having different manufacturing processes are stacked and a pattern embedded in a depth direction is measured, generally, the electron beam is caused to be incident on the pattern at a high acceleration, thereby deepening an incident depth. Accordingly, it is possible to measure a deviation (overlay) occurring between the stacked patterns from the signal waveform of the secondary electron or the backscattered electron obtained when the electron beam passes through the pattern.

Even in the embodiment, in order to evaluate the property of the pattern embedded in the depth direction (sometimes referred to as an "internal pattern"), the electron beam is caused to be incident on the sample at a high acceleration voltage.

FIG. 4 is a cross-sectional perspective view illustrating an example of a pattern to be measured in the sample. A configuration of the sample other than patterns 4a to 4c is not illustrated. The surface of the sample is located on the Z-axis positive direction side.

FIG. 4A illustrates the ideal pattern 4a. The pattern 4a has two patterns 7a and 8a arranged in the depth direction, and both patterns are formed in a columnar shape having a diameter (dimension in the X direction) of 10 nm. In the pattern 4b illustrated in FIG. 4B, a diameter of a pattern 8b embedded in the depth direction is 7 nm, and is smaller than a diameter (10 nm) of a pattern 7b located on the surface. In the pattern 4c illustrated in FIG. 4C, a diameter of a pattern 8c embedded in the depth direction is 15 nm, and is larger than a diameter (10 nm) of a pattern 7c located on the surface.

FIG. 5 is a schematic diagram illustrating SEM images 5a to 5c in which the patterns 4a to 4c illustrated in FIG. 4 are observed from above. As illustrated in FIGS. 5A to 5C, the shapes of the patterns 7a to 7c located on the surface can be observed from the SEM images 5a to 5c, but the shapes of the patterns 8a to 8c inside the sample are difficult to be observed. Therefore, even though the volume of the internal pattern is changed as illustrated in the patterns 8b and 8c of FIG. 4, it is difficult to detect a volume change from the appearance of the SEM image captured from the sample surface.

Therefore, as a result of conducting careful examination in order to monitor the volume change of the internal pattern which is difficult to be detected from the appearance of the SEM image, it is found out that a signal amount of the secondary electron obtained by scanning the pattern with the electron beam depends on a volume amount of the pattern through which the electron beam passes. Therefore, the volume change of the internal pattern can be estimated from the signal waveform obtained when the electron beam passes through the pattern.

FIG. 6 is a diagram illustrating line profiles 6a to 6c obtained by integrating the brightness values of the SEM images 5a to 5c illustrated in FIG. 5 in the Y direction. The line profiles 6a to 6c (signal waveforms) respectively correspond to the SEM images 5a to 5c. The line profiles 6a to 6c show results obtained by actually outputting the conditions such as the design dimensions of the patterns 4a to 4c illustrated in FIG. 4 by a simulation.

As illustrated in FIG. 6, when a shape (diameter) of the internal pattern becomes small as shown in the pattern 4b (the volume of the pattern through which the electron beam passes becomes small), as shown in the line profile 6b, an overall shape of the line profile becomes smaller than that of the line profile 6a of the ideal pattern 4a. On the other hand, when the shape (diameter) of the internal pattern becomes large as shown in the pattern 4c (the volume of the pattern through which the electron beam passes becomes large), as shown in the line profile 6c, a width near the skirt of a peak of the line profile is wider than that of the line profile 6a of the ideal pattern 4a, from which it can be seen that there is the influence of the volume change.

FIG. 7 is a diagram illustrating a general method of calculating a pattern dimension from the line profile of the brightness value. FIG. 7 illustrates the line profiles 6a to 6c of FIG. 6.

First, in the left half and the right half of the peak of the line profile 6a, portions 201 and 204 having the lowest brightness values are respectively set to the brightness value of 0%, and portions 202 and 205 having the highest brightness values are respectively set to the brightness value of 100%. The peak of the line profile is a region between the places set as the portions 201 and 204 having the lowest brightness values. Since a portion where the brightness value increases (left side) and a portion where the brightness value decreases (right side) at the peak waveform respectively correspond to an edge portion of the pattern, places 203 and 206 having the brightness value of 50% are calculated on the left and right sides of the edge, and an interval therebetween is set as the dimension value of the pattern in the X direction.

In the same manner, with respect to the line profiles 6b and 6c, an interval between the places where the brightness value is 50% at the peak (peak width) can be set as the dimension value of the patterns 4b and 4c.

However, since the peak width at the brightness value of 50% of the line profiles 6b and 6c is almost the same as the peak width at the brightness value of 50% of the line profile 6a, it is determined that all the dimensions of the patterns 4a to 4c are almost the same. As described above, when detecting a shape change of the line profile caused by the volume change of the internal pattern, a general method of calculating the dimension from a white band by setting a threshold value from the swelling of the line profile can or cannot observe a dimensional change depending on the set threshold value, and has a different maximum brightness value for each pattern, from which it can be seen that the general method is not an effective method.

FIG. 8A is a cross-sectional perspective view illustrating an ideal pattern 14a. The pattern 14a has two horizontal nanowires 17a and 18a arranged in the depth direction. Cross sections of the horizontal nanowires 17a and 18a are almost circular shapes and the diameters thereof are equal to each other. FIG. 8B is a schematic perspective view illustrating a pattern 14b formed in the sample. The pattern 14b has two horizontal nanowires 17b and 18b arranged in the depth direction. A cross section of the horizontal nanowire 17b located above (the surface side of the sample) is almost circular shape, but a cross section of the lower horizontal nanowire 18b is almost elliptical shape, which indicates an unideal pattern case where the volume change of the internal pattern occurs.

The patterns 14a and 14b having the shapes illustrated in FIGS. 8A and 8B are actually generated, the SEM images (not illustrated) are obtained, and the line profiles of the brightness values are extracted from the SEM images. FIG. 8C is a diagram illustrating line profiles 16a and 16b acquired from the SEM images of the patterns 14a and 14b. When comparing the line profiles 16a and 16b, it can be seen that a shape near the skirt of the peak left side of the line profile 16b is different from a shape near the skirt of the peak left side of the line profile 16a. As described above, it can be assumed that from the line profile of the brightness value, the internal pattern shape of the pattern 14a is formed as shown in the horizontal nanowire 18a in FIG. 8A, and the internal pattern shape of the pattern 14b is formed as shown in the horizontal nanowire 18b in FIG. 8B.

Here, in the embodiment, the feature amount at the peak (predetermined region) of the line profile (signal waveform) is calculated for each pattern, and a difference from the feature amount (reference value) at the peak of the line profile obtained from the ideal pattern is calculated. Accordingly, it is possible to detect the volume change of the pattern embedded in the depth direction from the line profile (two-dimensional information) of the SEM image of the sample. The details of the feature amount of the line profile will be described later.

FIG. 9 is a flowchart illustrating a pattern evaluation method according to the embodiment. The pattern evaluation method according to the embodiment is performed by using the pattern evaluation system 1 in FIG. 1 or the pattern evaluation system 2 in FIG. 2.

First, a user introduces the sample 112 to a sample introduction part (not illustrated) such as a wafer cassette in advance. In step S1, when the user inputs an instruction to start an operation of the pattern evaluation system by the input and output part 104, the overall control part 102 drives a sample conveyance mechanism which is not illustrated, takes out the sample 112 from the sample introduction part, introduces the sample 112 to the charged particle beam emission subsystem 101, and places the sample 112 on the stage 113 (wafer load).

In step S2, the overall control part 102 drives the stage 113 and an image shift (not illustrated), thereby moving the sample 112 so that a pattern to be measured is irradiated with the electron beam 107.

In step S3, the overall control part 102 drives each optical element of the charged particle beam emission subsystem 101, irradiates the sample 112 with the electron beam 107 at a predetermined acceleration voltage, and scans the pattern.

In step S4, the detectors 119 and 121 of the charged particle beam emission subsystem 101 output a detected secondary electron or a backscattered electron signal to the SEM image generation part 501 of the signal processing part 103. The SEM image generation part 501 of the signal processing part 103 generates an SEM image (two-dimensional image) by arranging the secondary electron or the backscattered electron in a time series.

In step S5, the computer subsystem 502 receives the SEM image from the SEM image generation part 501 of the signal processing part 103, the brightness evaluation part 503 integrates the brightness of the SEM image in the Y direction of the image, and extracts a line profile.

In step S6, the calculation part 504 receives the line profile from the brightness evaluation part 503, and calculates a feature amount at the peak of the line profile.

In step S7, the calculation part 504 stores the feature amount of the line profile in the memory part 505. The calculation part 504 outputs the feature amount of the line profile to the display part 506 as a measurement data file. Steps S2 to S6 may be performed at a plurality of measurement points in the sample 112, the feature amount of the line profile may be calculated from the SEM image at each measurement point, and the calculated feature amount thereof may be stored in the memory part 505 and then outputted to the display part 506 as the file.

In step S8, the computer subsystem 502 receives a feature amount of a reference line profile of an ideal pattern from the calculation part 514 of the computer subsystem 512. The calculation part 504 compares the feature amount of the reference line profile with the feature amount of the line profile calculated in step S6, and calculates a difference between these feature amounts. The calculation part 504 stores the difference between the feature amounts in the memory part 505, and outputs the difference therebetween to the display part 506 as the measurement data file. Hereinafter, the "difference between the feature amount of the line profile and the feature amount of the reference line profile" may be simply referred to as a "difference between the feature amounts".

As the feature amount (reference value) of the reference line profile, as long as the line profile of the pattern obtained by a simulation in the computer subsystem 512 well matches the line profile of the SEM image obtained by imaging the sample 112 with a shape such a height and a width, the result of the simulation can be adopted.

Alternatively, the feature amount of the reference line profile can be obtained by the computer subsystem 512 as follows. First, steps S2 to S7 are performed for a plurality of measurement points in the surface of the sample 112, and the calculation part 504 acquires the feature amounts of the line profiles at the plurality of measurement points. The calculation part 504 outputs the feature amounts of the line profiles at the plurality of measurement points to the calculation part 514 of the computer subsystem 512. The calculation part 514 calculates an average value of the feature amounts of the line profiles at the plurality of measurement points, and adopts the feature amount of the line profile closest to the average value as a reference value, thereby outputting the adopted feature amount to the calculation part 504 of the computer subsystem 502.

The feature amount of the reference line profile can be obtained as follows. First, steps S2 to S7 are performed for a plurality of measurement points in the surface of the sample 112, and the calculation part 504 acquires the feature amounts of the line profiles at the plurality of measurement points. Next, a cross section is formed for each measurement point by using a processing device such as a FIB device, and the formed cross section is observed by the charged particle beam emission subsystem 101. Next, the calculation part 514 of the computer subsystem 512 calculates a pattern dimension of the cross section based upon the image of the cross section. Next, the calculation part 514 compares the pattern dimension of each cross section with inputted design data, adopts the feature amount of the line profile at the measurement point which is the pattern closest to the ideal pattern as the reference value, and outputs the adopted feature amount to the calculation part 504 of the computer subsystem 502.

In step S9, the calculation part 504 confirms whether the pattern satisfies a manufacturing specification from the difference between the feature amounts.

In determining whether the pattern satisfies the manufacturing specification, when comparing, for example, the difference between the feature amounts with a predetermined threshold value, and the difference between the feature amounts is less than the threshold value (may be equal to or less than the threshold value), the calculation part 504 can determine that the pattern satisfies the manufacturing specification. As another example, the calculation part 504 may convert the difference between the feature amounts calculated with respect to the plurality of measurement points into a histogram, may calculate 3σ of the histogram, and may determine that a pattern in which the difference between the feature amounts is within a range of 3σ satisfies the manufacturing specification.

The predetermined threshold value to be compared with the difference between the feature amounts is stored in the memory part 505 in such a manner that a user inputs the predetermined threshold value by using the input part 507, for example, before the sample 112 is introduced in step S1 or in step S9, and is read by the calculation part 504. The calculation part 504 may automatically calculate the predetermined threshold value based upon the design data (sample information) inputted by the user. The predetermined threshold value may be stored in another storage medium accessible by the computer subsystem 502, or may be stored in the memory part 105 of the computer subsystem 100 or the memory part 515 of the computer subsystem 512.

When the measured pattern satisfies the manufacturing specification (Yes in step S9), the process proceeds to step S10, the calculation part 504 determines that there is no volume change of the pattern, and outputs the result to the display part 506. When the measured pattern does not satisfy the manufacturing specification (No in step S9), the process proceeds to step S11, the calculation part 504 determines that the volume change of the pattern occurs, and outputs the result to the display part 506.

As described above, the feature amount of the line profile is calculated, the difference from the feature amount of the reference line profile is calculated, and it can be determined whether the internal pattern satisfies the manufacturing specification from the difference between the feature amounts.

A detailed calculation method of the feature amount at the peak of the line profile will be described by using the line profile 6a illustrated in FIG. 7. For example, when the feature amount of the line profile is set as an area value, a method of calculating the area value is described as follows. First, a line segment connecting the portions 201 and 204 having the lowest brightness value at the peak of the line profile 6a is set as a lower bottom of the area, and a primary asymptotic line (dotted line in FIG. 7) is drawn. Next, for example, Gaussian approximation is used, and fitting is performed by a function capable of approximating only the peak. Next, the area value of the line profile can be obtained by integrating a region sandwiched between the primary asymptotic line and the fitting function (not illustrated).

As another calculation method of the area value of the line profile, it is also possible to calculate the sum of the number of pixels of an image existing in the region sandwiched between the primary asymptotic line and the fitting function, and to set the calculated sum as the area value of the line profile.

Another calculation method of the area value of the line profile is described as follows. First, at the peak of the line profile 6a, a line segment connecting the portions 201 and 204 having the lowest brightness value is set as a lower bottom of the area, a line segment connecting the portions 202 and 205 having the highest brightness value is set as an upper bottom, and primary asymptotic lines are respectively drawn (dotted line in FIG. 7). Next, a primary asymptotic line (not illustrated) is drawn even in a portion inclined forward and backward of the peak. The sum of the number of pixels existing in a region surrounded by the four asymptotic lines generated in this manner can be calculated and set as the area value.

As apparent from FIGS. 7 and 8, the area value of the line profile depends on the volume of the pattern through which the electron beam passes. Therefore, the area value is calculated as the feature amount of the line profile and the difference from the area value of the line profile of the ideal pattern is obtained, whereby it is possible to determine whether the volume change occurs in the internal pattern in the manufacturing process. The same determination as described above is performed for a plurality of measurement points, whereby it is possible to specify a location where the volume change occurs in the surface of the sample 112.

As the feature amount of the line profile, in addition to the area value of the peak, an inclination of the peak of the line profile, a peak width of the line profile, and a difference between the maximum value and the minimum value of the brightness value at the peak of the line profile may be respectively set as the feature amounts.

The GUI screen displayed on the display part 506 will be described with reference to FIGS. 10 to 12. First, the output of the file in the above-descried steps S7 and S8 will be described.

Figures 10A, 10B:
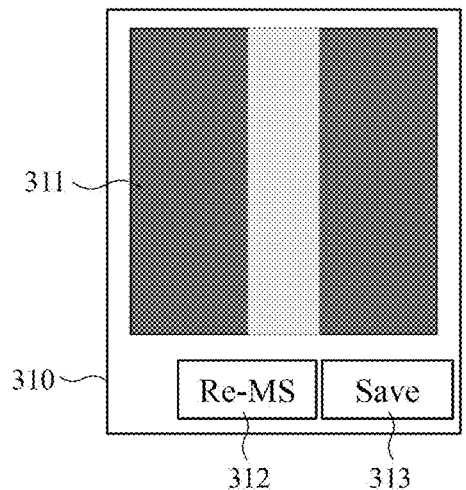
FIGS. 10A and 10B are schematic diagrams illustrating a GUI screen of a file in which measurement data are recorded.

FIG. 10A is a diagram illustrating a file 300 in which measurement data at respective measurement points in the sample 112 are recorded. The file 300 records an image name 301 (Image Name), a measurement point 302 (Position X, Position Y) in the surface of the sample 112, and measurement data 303. Although not illustrated herein, items of the measurement data 303 include the dimension value of the pattern calculated by the calculation part 504, the feature amount of the line profile, and the difference between the feature amounts.

FIG. 10B is a diagram illustrating an image operation screen 310. The image operation screen 310 is displayed, for example, when a user clicks a cell 304 in the file 300 by using the input part 507 (for example, a mouse). On the image operation screen 310, an SEM image 311 at the measurement point selected by the cell 304, a Re-MS button 312, and a Save button 313 are displayed. When the user clicks the Re-MS button 312, an instruction is transmitted to the overall control part 102 of the computer subsystem 100 and the charged particle beam emission subsystem 101 is driven, thereby making it possible to acquire the SEM image again for the same measurement point, and to measure the length of the pattern. When reflecting a result of the remeasured length in the file 300, the user clicks the Save button 313. The result of the remeasured length can be outputted from the signal processing part 103 to the computer subsystem 502, thereby analyzing the pattern property.

FIG. 11 is a schematic diagram illustrating a GUI screen for visualizing and displaying the measurement data 303. FIG. 11A illustrates a selection screen 350 for selecting a visualization method of the measurement data 303. When the user clicks a measurement data button 351 on the selection screen 350, the file 300 (list of measurement data) illustrated in FIG. 10A is displayed.

Figure 11A:
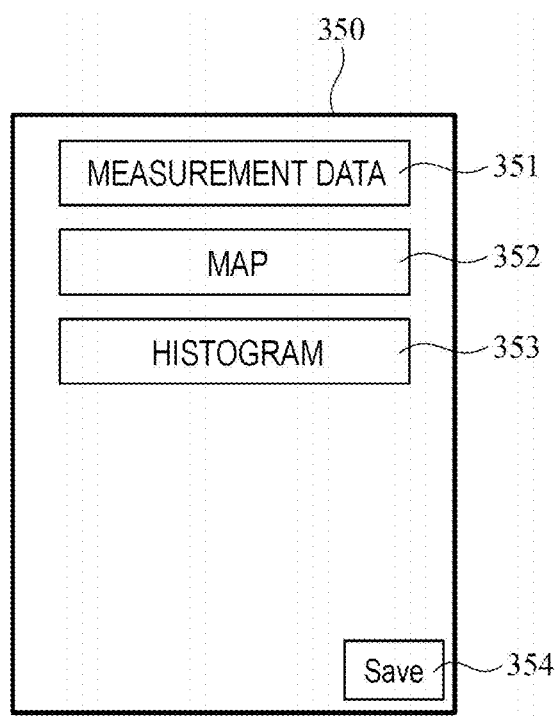
FIGS. 11A to 11D are schematic diagrams illustrating a GUI screen for visualizing and displaying the measurement data.
Figure 11B:
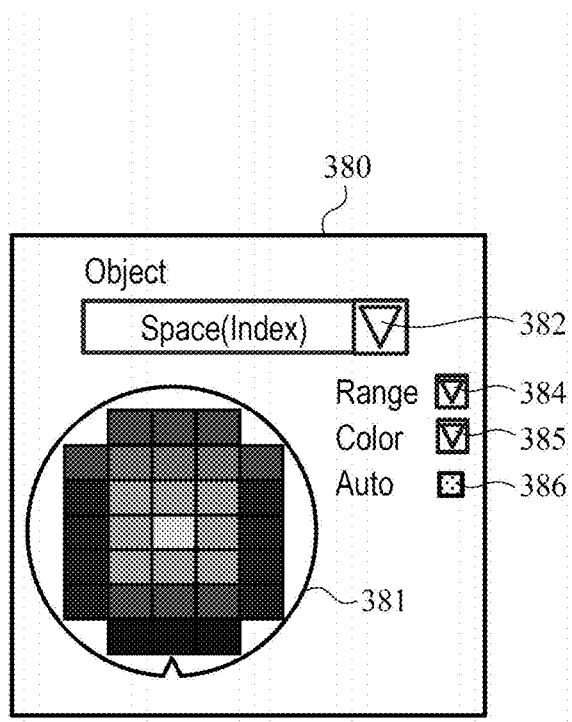

FIG. 11B illustrates a map screen 380 generated based upon the measurement data 303. A wafer map 381 which is a distribution of the measurement data 303 in the sample 112 (wafer) is displayed on the map screen 380. The calculation part 504 generates the wafer map 381 with reference to the information recorded in the file 300 when the user clicks the map button 352 on the selection screen 350 in FIG. 11A.

Figure 11C:
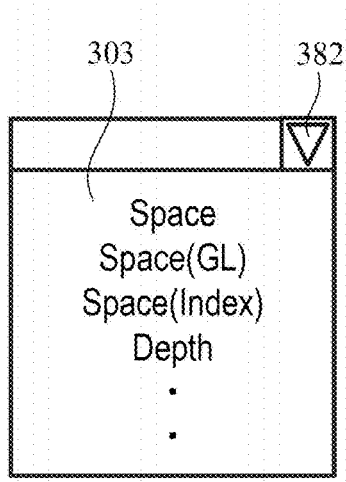

The tab 382 on the map screen 380 is a tab for the user to select an item of the measurement data 303 to be visualized as the wafer map 381. FIG. 11C is a screen displayed by clicking the tab 382, and the screen displays items of the measurement data 303 that the user wants to visualize as the wafer map 381 as a selection.

A Range tab 384 of the map screen 380 is a tab for selecting a range in which the distribution of the measurement data 303 is displayed as the wafer map 381, and a Color tab 385 is a tab for selecting a color at that time. The user clicks an Auto button 386, thereby making it possible to automatically determine a display range and a color appropriate for the respective measurement data. When additionally recording a result (color, display range, and the like) visualized on the map screen 380 in the file 300, a Save button 354 on the selection screen 350 in FIG. 11A is clicked, thereby saving the result.

Figure 11D:
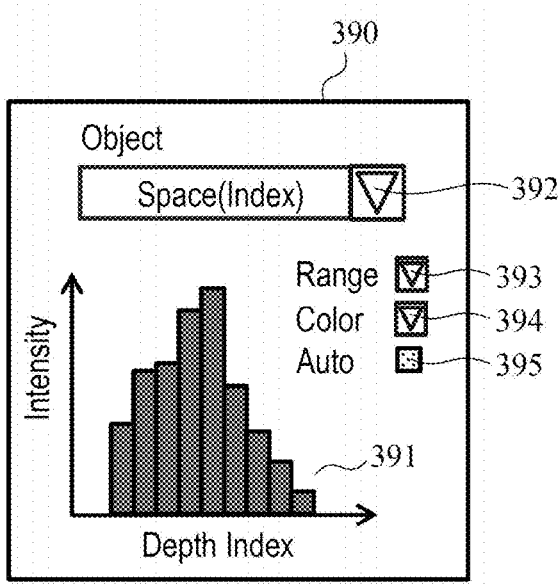

FIG. 11D illustrates a histogram screen 390 generated based upon the measurement data 303. A histogram 391 which is a statistical distribution of the measurement data 303 is displayed on the histogram screen 390. The calculation part 504 generates the histogram 391 with reference to the information recorded in the file 300 when the user clicks a histogram button 353 on the selection screen 350 in FIG. 11A. A tab 392 is a tab for the user to select an item of the measurement data 303 to be visualized as the histogram 391, and has the same function as that of the tab 382.

A Range tab 393, a Color tab 394, and an Auto button 395 on the histogram screen 390 are the same as the Range tab 384, the Color tab 385, and the Auto button 386 on the map screen 380 described above. When additionally recording a result visualized on the histogram screen 390 in the file 300, the Save button 354 on the selection screen 350 in FIG. 11A is clicked, thereby saving the result.

Next, the GUI screen for the determination in step S9 will be described. FIG. 12 is a schematic diagram illustrating a GUI screen 400 for managing the measurement data 303. On the GUI screen 400, an SEM image 330 at a certain measurement point and its line profile 320, the map screen 380 of the measurement data 303, and the histogram screen 390 can be displayed.

When a Read button 411 on the GUI screen 400 is clicked, a data file to be visualized can be selected, and the selected data file is reflected on the map screen 380 or the histogram screen 390. As illustrated in FIG. 12, the map screen 380 includes a tab 403 and a threshold value input screen 405, and the histogram screen 390 includes a tab 404 and a threshold value input screen 406.

The tabs 403 and 404 are tabs for selecting a method of determining whether the manufacturing specification is satisfied in the above-described step S9 (FIG. 9). For example, when Ref of the tab 403 or 404 is selected, the calculation part 504 performs the above-described determination by comparing the reference value with the measurement data 303. As the reference value, for example, a value in the case of an ideal pattern and a value calculated by a simulation can be set.

The user can set the threshold value of the measurement data 303 from the threshold value input screens 405 and 406. The threshold value is a threshold value of a difference between the measured feature amount and the reference value. The calculation part 504 refers to the threshold value in step S9 (FIG. 9) described above, and can determine that the data that are equal to or greater than the threshold value do not satisfy the manufacturing specification and there is the volume change of the pattern (defective).

When Fre of the tabs 403 and 404 is selected, the measurement data 303 can be managed by statistical processing. In this case, the calculation part 504 generates a histogram with respect to the difference between the feature amounts at the plurality of measurement points in step S9 described above, and calculates the 3σ. With respect to a pattern of data within the range of 3σ, it can be determined that there is no volume change and thus the manufacturing specification is satisfied (good), and with respect to a pattern of data outside the range of 3σ, it can be determined that there is the volume change and thus the manufacturing specification is not satisfied (defective).

In steps S10 and S11 (FIG. 9) described above, for example, as shown in the map screen 380 and the histogram screen 390 in FIG. 12, colors of data 407 and 408 that do not satisfy the manufacturing specification may be displayed in colors different from the data that satisfy the manufacturing specification. By clicking the data 407 or 408 that do not satisfy the manufacturing specification, the measurement number 408, the SEM image 330, and the line profile 320 at that location can also be displayed on the GUI screen 400.

As described above, the feature amounts of the line profiles obtained at a plurality of measurement points are visualized as a wafer map, thereby making it possible to narrow down a location where the volume change of the pattern occurs. When the location where the volume change occurs can be narrowed down, a location where the cross-section observation is performed can also be narrowed down.

As the measurement data 303 managed by the GUI screen 400, an example of the difference between the feature amount of the line profile and the reference value is described, and with respect to other measurement data 303 such as the dimension value of the pattern, the wafer map and the histogram can be generated in the same manner as described above, and it can be determined whether the manufacturing specification is satisfied.

The calculation part 504 can also feed-back the measurement data such as a place where there is the volume change of the pattern and its dimension to a pattern manufacturing device (exposure device and etching device). As a result, it is possible to contribute to improving a yield in a semiconductor product manufacturing process.

[Technical Effect]

In the related arts, at a stage of researching and developing the pattern of the semiconductor product, in order to confirm whether the volume change in the pattern occurs, the pattern is processed by using the FIB device, and a cross section is observed by using a TEM device and an AFM device. In this method, several hours are required to observe one section of the cross section.

On the other hand, as shown in the pattern evaluation system of the embodiment, the property of the internal pattern is evaluated by using only the information of the SEM image (the feature amount of the line profile of the brightness value), thereby making it possible not only to perform observation of a plurality of places of the wafer in a few minutes, but also to contribute to shortening a development period.

Even at a process manufacturing stage of the semiconductor product, the feature amounts of the line profiles at a plurality of measurement points in the wafer surface are acquired, and the difference from the reference value and its 3σ are visualized as the wafer map, whereby feedback can be performed to the exposure device and the etching device. Thus, it is possible to contribute to improving the yield in the semiconductor product manufacturing process.

In the same manner, even at a mass production stage of the semiconductor product, the feature amount is acquired from the line profile used for the measurement, and the difference from the reference value and its 3σ are calculated, whereby a place deviating from 3σ can be removed from the mass production. As a result, it is possible to reduce a mass production defect of the semiconductor pattern and contribute to improving the yield.

Second Embodiment

[Pattern Evaluation System]

A second embodiment is different from the first embodiment in that two SEM images are acquired by changing the acceleration voltage of the electron beam at the same measurement point of the sample, and the difference between the line profiles obtained from the two SEM images is calculated. Accordingly, it is possible to evaluate a pattern whose depth is limited by calculating a differential line profile in this manner.

With respect to a device configuration of a pattern evaluation system according to the second embodiment, since the same configuration as that of the first embodiment can be adopted, and the description thereof will be omitted.

[Sample]

FIG. 13 is a schematic perspective view illustrating a sample according to the second embodiment. As illustrated in FIG. 13, in the sample of the embodiment, a gate 28 through which a plurality of patterns 24 are penetrated is formed in a wafer 27, and the plurality of patterns 24 are horizontal nanowires arranged in an X-axis direction and a depth direction (Z-axis direction).

For example, when the acceleration voltage is set to 1000 V and 5000 V at the same measurement point of the sample and the electron beam is emitted from above (from the Z-axis positive direction side to the negative direction side), the electron beam passes through a first depth at the acceleration voltage of 1000 V, and the electron beam passes through a second depth (first depth<second depth) at the acceleration voltage of 5000 V. When the line profile of the SEM image is extracted for each acceleration voltage, information on the gate 28 and the pattern 24 is mixed even in any line profile. Since the volume of the gate 28 through which the electron beam passes is the same, a difference between the line profile obtained at the acceleration voltage of 1000 V and the line profile obtained at the acceleration voltage of 5000 V is acquired. The differential line profile indicates information on the volume of the pattern 24 located below (between the first depth and the second depth) in the sample. Therefore, the volume change of the pattern 24 whose depth is limited can be detected by changing the acceleration voltage and analyzing the differential line profile.

[Pattern Evaluation Method]

FIG. 14 is a flowchart illustrating a pattern evaluation method according to the second embodiment. Since steps S21 to S25 are the same as steps S1 to S5 in FIG. 9 described in the first embodiment, the description thereof will be omitted.

In step S26, the overall control part 102 determines whether the acquisition of the line profile in step S25 is the first time. When it is the first time (Yes), the process proceeds to step S27, and the overall control part 102 changes the acceleration voltage based upon, for example, the user's input from the input and output part 104. Thereafter, the process returns to step S23 again, and steps S23 to S25 are executed at the same measurement point.

After executing steps S23 to S25 the second time, in step S26, the overall control part 102 determines that the acquisition of the line profile is the second time (No), and proceeds to step S28.

In step S28, the calculation part 504 calculates a difference between the line profiles acquired for the respective acceleration voltages, and sets the difference therebetween as the differential line profile.

In step S29, the calculation part 504 calculates a feature amount for the differential line profile.

In step S30, the calculation part 504 stores the feature amount of the differential line profile in the memory part 505. The calculation part 504 outputs the feature amount of the differential line profile to the display part 506 as a measurement data file. Steps S22 to S29 may be executed at a plurality of measurement points in the sample 112, the feature amount of the differential line profile may be calculated from the SEM image at each measurement point, and the feature amount thereof may be stored in the memory part 505 and then outputted to the display part 506 as the file.

In step S31, the computer subsystem 502 receives a feature amount of a reference line profile of an ideal pattern from the calculation part 514 of the computer subsystem 512. The calculation part 504 compares the feature amount of the reference line profile with the feature amount of the differential line profile calculated in step S30, and calculates a difference between these feature amounts. The calculation part 504 stores the difference between the feature amounts in the memory part 505 and outputs the difference therebetween to the display part 506 as the measurement data file.

Since steps S32 to S34 are the same as steps S9 to S11 in FIG. 9 described in the first embodiment, the description thereof will be omitted.

FIG. 15 is a diagram illustrating a GUI screen for setting the acceleration voltage in the imaging of the same measurement point. In step S23, a user sets an acceleration voltage 450 of an electron beam incident on the first time by using the input and output part 104, and clicks a SET button 451. In step S27 described above, the user sets an acceleration voltage 453 of an electron beam incident on the second time, and clicks a SET button 454.

The acceleration voltage set in the scan of the first pattern (step S23) and the value of the acceleration voltage changed in step S27 may be automatically set by the overall control part 102. In this case, for example, based upon sample information such as a design dimension of the pattern 24 and the gate 28, and a distance between the patterns 24 in the depth direction, a depth for evaluating the property of the pattern is calculated, and the acceleration voltage is set so that the depth can be irradiated with the electron beam.

[Technical Effect]

As described above, the second embodiment adopts a configuration in which the SEM image is acquired by changing the acceleration voltage at the same measurement point, and the difference between the line profiles for the respective acceleration voltages is obtained. Accordingly, it is possible to detect the volume change of the pattern whose depth is limited.

Third Embodiment

[Pattern Evaluation System]

A third embodiment is different from the first embodiment in that the third embodiment includes a process of applying a metal film to a pattern surface in order to increase a signal amount obtained from a pattern.

Figure 16A:
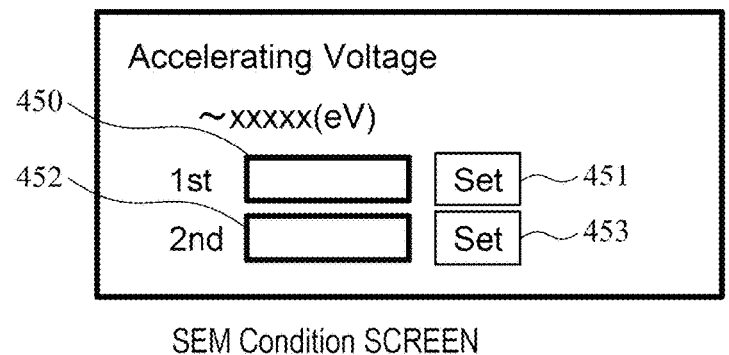
FIGS. 16A and 16B are cross-sectional views illustrating an example of a pattern to be measured according to a third embodiment.

FIG. 16 is a cross-sectional view illustrating an example of a pattern to be measured according to the third embodiment. As illustrated in FIG. 16A, for example, a pattern 34b which is a protrusion of the semiconductor is formed in a wafer 31. Although an ideal cross-sectional shape of the protrusion formed in the wafer 31 is a pattern 34a (dotted line in FIG. 16A), in the manufacturing process, it is assumed that the shape thereof is changed to an inversely tapered shape as shown in the pattern 34b. In this case, in the SEM image obtained by imaging the patterns 34a and 34b from above, the patterns 34a and 34b are imaged to have the same shape.

Since the pattern 34a and the pattern 34b have different volumes through which the electron beam passes, it is assumed that shapes of the line profiles are different. However, when a difference between the volume of the ideal pattern 34a and the volume of the formed pattern 34b is very small, since a change in the shape of the obtained line profile is also very small, it is difficult to evaluate whether the volume of the pattern is changed based upon the line profile. Therefore, in the embodiment, a metal film 37 is formed on the pattern surface in advance before measurement, and the signal amount obtained from the pattern is increased, thereby detecting a finer volume change.

Figure 16B:
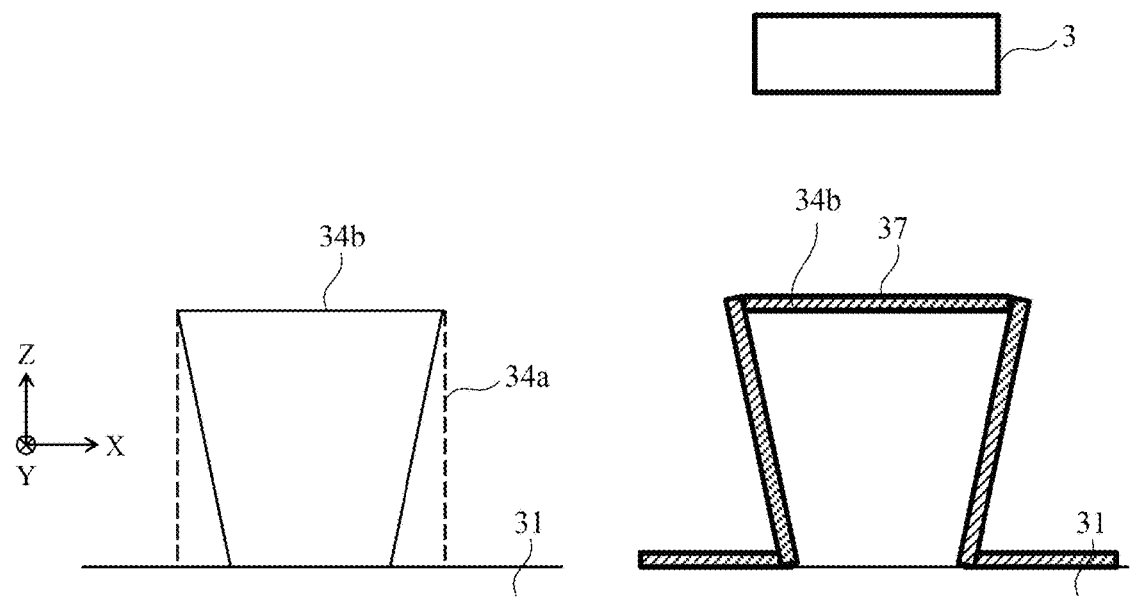

FIG. 16B is a cross-sectional view illustrating a state where the metal film 37 is formed on the surface of the pattern 34b. The metal film 37 can be formed by a well-known method such as vapor deposition and atomic layer deposition using a deposition device 3.

[Pattern Evaluation Method]

In a pattern evaluation method according to the embodiment, first, a process of forming the metal film 37 on the surface of the sample is executed, after which each process can be executed in the same manner as that of the pattern evaluation method according to the first embodiment (FIG. 9).

In the manufacturing process of the semiconductor product (sample), a metal film is also applied to the surface of the embedded pattern, or a metal is doped inside the pattern, thereby making it also possible to detect the finer volume change by increasing the signal amount from the internal pattern.

In recent years, a metal gate using metal as a gate material attracts attention in order to further improve the performance of a fine device. Since the signal amount generated when the electron beam passes through the gate is amplified by using the gate material as a metal material, it is possible to detect a minute volume change by using the feature amount of the line profile. Accordingly, the finer volume change can be detected not only when the metal film is applied to the pattern surface, but also when the periphery of the pattern is the metal material.

[Technical Effects]

As described above, the pattern evaluation system according to the third embodiment includes the deposition device 3 for forming the metal film 37 on the sample surface, and executes the process of applying the metal film on the pattern surface. Accordingly, the signal amount obtained from the pattern can be increased, and thus the finer volume change of the pattern can be detected.

Fourth Embodiment

In the first embodiment, an example in which the pattern to be measured is the horizontal nanowire formed inside the sample is described, and in the fourth embodiment, a volume change of a hole pattern formed in the sample is detected.

[Sample]

Figures 17A, 17B:
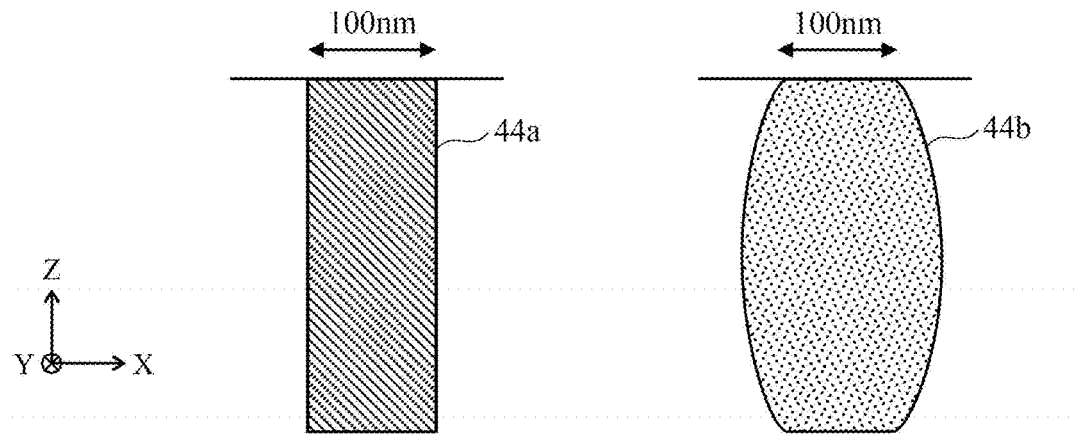
FIGS. 17A to 17E are cross-sectional views illustrating an example of a sample according to a fourth embodiment and a schematic diagram illustrating an SEM image in the sample is observed from above.

FIG. 17 is a schematic view illustrating an example of a sample according to the fourth embodiment. FIG. 17A illustrates a cross-sectional view of a hole pattern 44a, and FIG. 17B illustrates a cross-sectional view of a hole pattern 44b. As illustrated in FIG. 17A, the hole pattern 44a is an ideal pattern having a uniform diameter, whereas the hole pattern 44b has a larger diameter at a middle part in the Z direction as illustrated in FIG. 17B. For example, in the manufacturing of 3D-NAND, in a process of forming the hole pattern in a laminate by dry etching, when a surface shape of the hole pattern and an incident angle of etching gas vary, a volume change such as bowing occurs inside as shown in the hole pattern 44b of FIG. 17B.

Figures 17C, 17D:
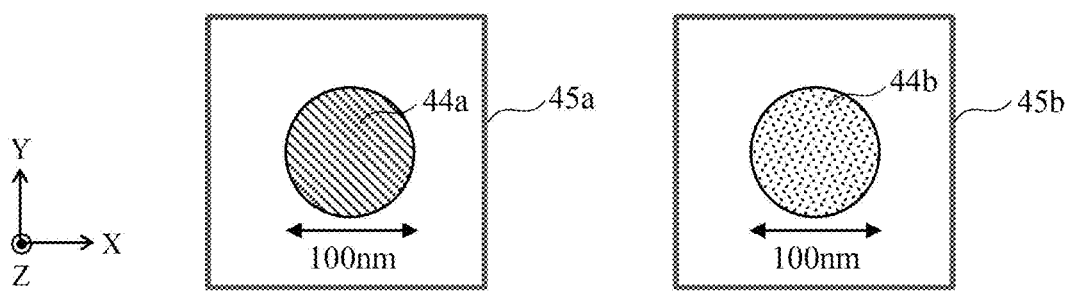

FIG. 17C illustrates an SEM image 45a obtained by imaging a place where the hole pattern 44a is formed, and FIG. 17D illustrates an SEM image 45b obtained by imaging a place where the hole pattern 44b is formed. As illustrated in FIGS. 17C and 17D, in the SEM images 45a and 45b from above the sample, although the shapes of the hole patterns 44a and 44b on the sample surface can be observed, the internal shapes thereof cannot be observed.

[Pattern Evaluation System]

Figure 17E:
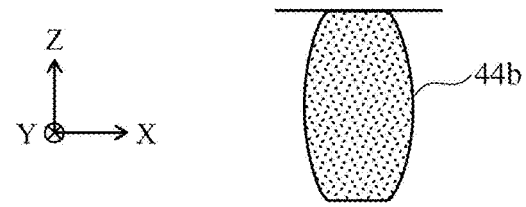

Here, in the embodiment, before measurement, the inside of the hole pattern is filled with the metal material in advance, the SEM image is acquired, and the line profile is extracted. The signal amount obtained by filling the metal material can be increased, whereby a minute volume change of the hole pattern can be detected. Therefore, the pattern evaluation system of the embodiment further includes a filling device for filling the hole pattern formed in the sample with the metal material. FIG. 17E is a diagram illustrating the hole pattern 44b and a filling device 9. As illustrated in FIG. 17E, the filling device 9 is disposed, for example, above the hole pattern 44b.

[Pattern Evaluation Method]

FIG. 18 is a flowchart illustrating a pattern evaluation method according to the fourth embodiment. First, in step S41, a user uses the filling device 9 to fill the inside of the hole pattern with the metal material. Accordingly, it is possible to acquire the line profile including information on the volume of the metal material inside the hole pattern. Since steps S42 to S52 are the same as steps S1 to S11 in the pattern evaluation method (FIG. 9) according to the first embodiment, the description thereof will be omitted.

The material filled in the hole pattern in the embodiment is not limited to the metal material, and may be another material.

[Technical Effect]

As described above, in the fourth embodiment, the metal material is filled in the hole pattern, the line profile is extracted from the SEM image, and the feature amount is calculated to evaluate the volume change of the hole pattern. In this manner, the volume change of the hole pattern is evaluated and the result is fed back to the etching device and the exposure device, thereby making it possible to contribute to improving the yield of the manufacturing process.

Fifth Embodiment

[Pattern Evaluation System]

In the first embodiment, an example in which the volume change of the pattern formed in the sample 112 is detected by using the SEM image obtained by imaging the sample 112 by the charged particle beam emission subsystem 101 is described. In the fifth embodiment, an example in which the volume change of the pattern is detected offline by using the already acquired SEM image will be described. That is, the pattern evaluation system of the embodiment is different from the first embodiment in that the pattern evaluation system of the embodiment does not include the charged particle beam emission subsystem 101 and evaluates the property of the pattern based upon the already acquired SEM image.

Figure 19A:
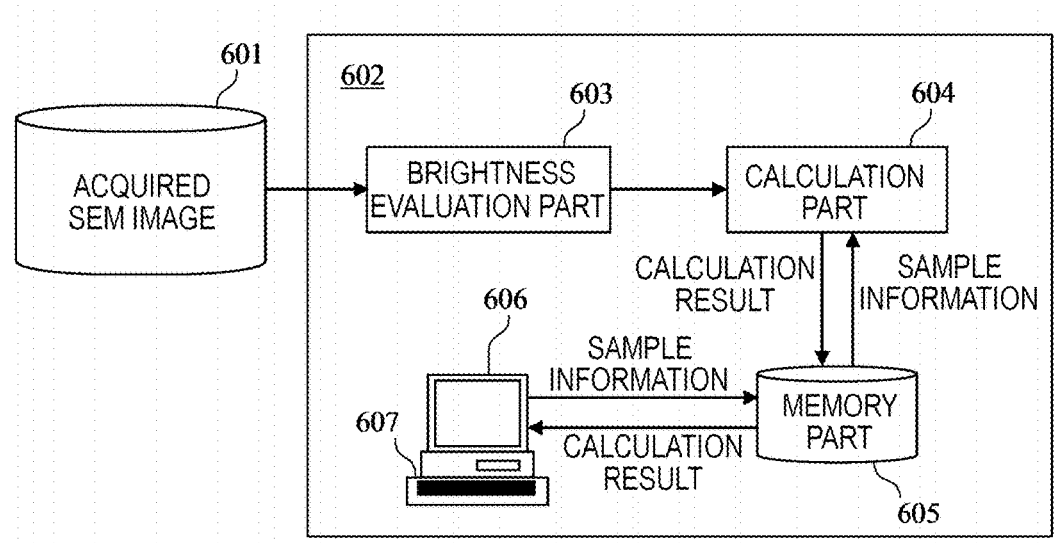
FIGS. 19A and 19B are functional block diagrams of a signal processing part according to a fifth embodiment.

FIG. 19A is a functional block diagram of a computer subsystem 602 according to the fifth embodiment. As illustrated in FIG. 19A, the computer subsystem 602 includes a brightness evaluation part 603, a calculation part 604, a memory part 605, a display part 606, and an input part 607. The brightness evaluation part 603 and the calculation part 604 can be configured by a processor such as a CPU or an MPU.

The brightness evaluation part 603 receives the already acquired SEM image from the SEM image storage part 601, extracts the line profile of the brightness value, and outputs the extracted line profile to the calculation part 604. The SEM image storage part 601 is a database and a data center accessible by the computer subsystem 602, and stores the SEM images acquired in the past.

Since the calculation part 604, the memory part 605, the display part 606, and the input part 607 are the same as the calculation part 504, the memory part 505, the display part 506, and the input part 507 of the computer subsystem 502 according to the first embodiment (FIG. 3A), the description thereof will be omitted.

Figure 19B:
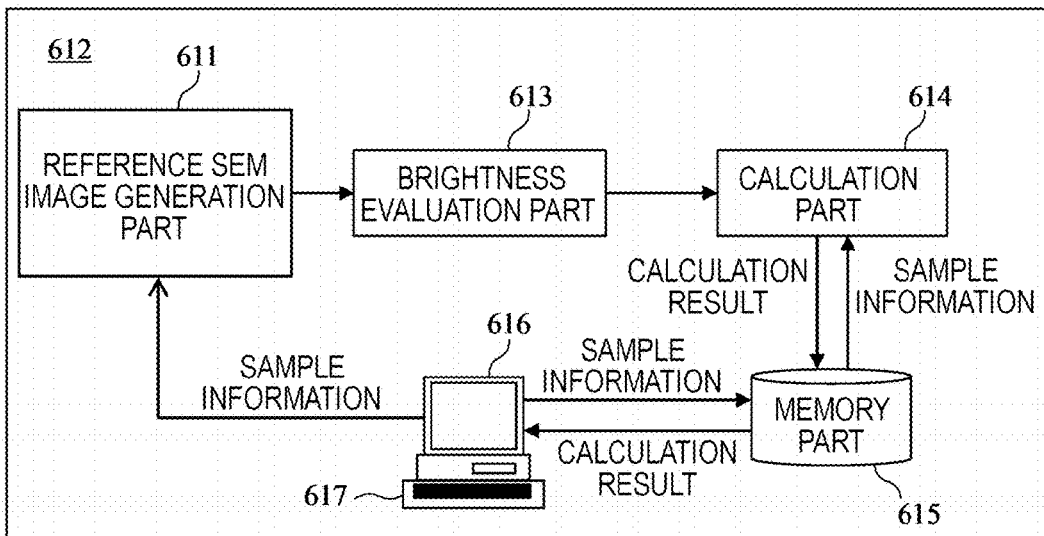

FIG. 19B is a functional block diagram of a computer subsystem 612 according to the fifth embodiment. The computer subsystem. 612 is connected to the computer subsystem 602 via a network which is not illustrated. The computer subsystem 612 includes a reference image generation part 611, a brightness evaluation part 613, a calculation part 614, a memory part 615, a display part 616, and an input part 617. The brightness evaluation part 613 and the calculation part 614 can be configured by a processor such as a CPU and an MPU.

The reference image generation part 611 generates a reference SEM image which is an SEM image of an ideal pattern, and outputs the reference SEM image to the brightness evaluation part 613. For example, the reference SEM image is generated by a simulation using information of the ideal pattern (design value) inputted from the input part 617 by a user. Alternatively, the reference image generation part 611 may receive a plurality of SEM images from the SEM image storage part 601, and may set the SEM image closest to the ideal pattern as the reference SEM image.

Since the brightness evaluation part 613, the calculation part 614, the memory part 615, the display part 616, and the input part 617 are the same as the calculation part 514, the memory part 515, the display part 516, and the input part 517 according to the computer subsystem 512 of the first embodiment (FIG. 3B), the description thereof will be omitted.

[Pattern Evaluation Method]

In the pattern evaluation method of the embodiment, steps S1 to S4 described in the first embodiment (FIG. 9) are not executed, and in step S5, the computer subsystem 602 receives the SEM image from the SEM image storage part 601. Since other steps are the same as those of the first embodiment, the description thereof will be omitted.

[Technical Effect]

As described above, the pattern evaluation system according to the fifth embodiment adopts a configuration in which the feature amount of the line profile is acquired from the already acquired SEM image, the difference from the feature amount (reference value) of the reference line profile is calculated, and the property of the pattern is evaluated. Accordingly, since the charged particle beam emission subsystem 101 is not required, it is possible to avoid enlargement of the pattern evaluation system.

Sixth Embodiment

[Pattern Evaluation System] In the first embodiment, an example in which the pattern to be measured is the horizontal nanowire formed inside the sample, and the volume change of the internal horizontal nanowire is detected is described, and in a sixth embodiment, a density change of a columnar pattern formed in the sample is detected.

[Sample]

FIG. 20 is a cross-sectional view illustrating an example of a columnar pattern to be measured according to the sixth embodiment. FIG. 20A illustrates an ideal columnar pattern 64a; and FIG. 20B illustrates a columnar pattern 64b in which a cavity 67 is formed. The columnar pattern 64a and the columnar pattern 64b have almost the same shape (size), but the density (volume) is different because the cavity 67 exists in the columnar pattern 64b.

FIG. 21 is a diagram illustrating line profiles 66a and 66b calculated by a simulation with respect to the columnar patterns 64a and 64b. As illustrated in FIG. 21, when comparing the line profile 66a obtained from the ideal columnar pattern 64a with the line profile 66b obtained from the columnar pattern 64b including the cavity, it can be seen that in the peak portion of the line profile, there is a difference in a profile shape in a portion having the highest brightness. A peak height of the line profile 66b is lower than that of the line profile 66a.

As described in the first embodiment (FIGS. 4 to 6), when the volume of the internal pattern becomes smaller than the ideal pattern 4a as shown in the pattern 4b, the shape of the line profile 6b of the pattern 4b becomes smaller than the shape of the line profile 6a of the pattern 4a as a whole.

On the other hand, as illustrated in FIG. 21, when the shape (dimension) of the ideal pattern and the shape (dimension) of the pattern to be measured are almost the same and the densities are different, since the size (surface area) of the pattern through which the electron beam passes is approximately the same, it can be seen that in the shape of the obtained line profile, an inclination of a place corresponding to an edge of the pattern is almost the same up to the top of the pattern. Thus, when the size (volume) of the pattern is changed (first embodiment) and when the density of the pattern is changed (sixth embodiment), it can be seen that the way of changing the shape of the line profile is different.

As described above, the shape and peak height of the line profile is compared with the reference line profile of the ideal pattern, whereby it is possible to estimate whether the volume change of the pattern occurs or the density change thereof occurs.

The inclination of a fitting function that approximates a peak width and a peak shape is calculated as the feature amount of the line profile, and compared with the reference line profile, whereby it may be determined whether the volume of the pattern is changed or the density thereof is changed. The peak width of the line profile may be calculated at a plurality of peak heights, and then may be compared with the peak width at each peak height of the reference line profile.

Any one or two or more of the peak area, the peak width, the peak height, and the inclination of the fitting function of the peak may be calculated as the feature amount of the line profile, and the property (shape, volume, and density) of the pattern may be analyzed. In this case, the memory part 505 stores data for determining what kind of change occurs in the pattern property from the combination of the feature amounts of the line profile.

When the difference between the feature amount of the line profile of the observed pattern and the feature amount of the reference line profile is small such that it is not possible to determine whether the volume of the pattern changes or the density thereof changes, a cross section obtained by cutting the pattern may be observed with an observation device such as a transmission electron microscope (TEM) and an atomic force microscope (AFM).

In this manner, whether the volume change occurs or the density change occurs in the pattern formed in the manufacturing process of the product is specified, and the specified result is fed back to the manufacturing device causing the change, thereby improving the yield of the product.

[Technical Effect]

As described above, in the sixth embodiment, the shape and peak height of the line profile of the pattern are compared with the shape and peak height of the reference line profile. Accordingly, it possible to detect the change in the density of the pattern even when the dimension of the pattern is not changed. Therefore, it is possible to manage the manufacturing process by specifying the place, in which the density variation occurs in the manufacturing process, and its cause.

[Modification]

The present disclosure is not limited to the above-described embodiments, and includes various modifications. For example, the above-described embodiments are described in detail for easy understanding of the present disclosure, and are not necessarily required to include all the configurations described above. Apart of one embodiment can be replaced with a configuration of another embodiment. The configuration of another embodiment can be added to the configuration of one embodiment. With respect to a part of the configuration of each embodiment, a part of the configuration of another embodiment can also be added, deleted, or replaced.

REFERENCE SIGNS LIST

1, 2: pattern evaluation system
3: deposition device
4, 14, 24, 34, 44, 64: pattern
5, 45: SEM image
6, 16, 66: line profile
9: filling device
27: wafer
28: gate
31: wafer
37: metal film
67: cavity
100, 502, 512, 602, 612: computer subsystem
101: charged particle beam emission subsystem (scanning electron microscope)
102: overall control part
103: signal processing part
104: input and output part
105: memory part
106: electron gun
107: electron beam
108: focusing lens
109: focusing lens
110: deflector
111: objective lens
112: sample
113: stage
114: emitted electron
115: deflector
116: detection aperture
117: reflection plate
118: tertiary electron
119: detector
120: tertiary electron
121: detector
123: deflector
130: shutter
131: blanking deflector
132: blanking electrode
200: network
500: SEM image storage part
501: SEM image generation part
503, 513, 603, 613: brightness evaluation part
504, 514, 604, 614: calculation part
505, 515, 605, 615: memory part
506, 516, 606, 616: display part
507, 517, 607, 617: input part

The invention claimed is:

1. A pattern evaluation system, comprising:
a computer subsystem that executes a process of evaluating a property of a pattern by reading a program from a memory that stores the program for evaluating the property of the pattern formed inside a sample, wherein the computer subsystem executes:
a process of acquiring an image of the sample;
a process of extracting a signal waveform from the image;
a process of calculating a feature amount in a predetermined region of the signal waveform;
a process of comparing the feature amount with a reference value of the feature amount; and
a process of evaluating the property of the pattern based upon a comparison result in the comparison process, wherein the reference value is the feature amount of the signal waveform of the pattern in which a plurality of patterns are embedded with respect to a surface of the sample, or the pattern which is formed in a depth direction with respect to the surface of the sample.

2. The pattern evaluation system according to claim 1, wherein
the feature amount is any one or more of an area, a height, a width, and an inclination in the predetermined region of the signal waveform.

3. The pattern evaluation system according to claim 1, wherein
the computer subsystem evaluates any one or more of a volume and a density of the pattern as the property of the pattern.

4. The pattern evaluation system according to claim 1, wherein
the computer subsystem evaluates the property of the pattern based upon a difference between the feature amount and the reference value in the process of evaluating the property of the pattern.

5. The pattern evaluation system according to claim 1, wherein
the signal waveform is a line profile of a brightness value of the image.

6. The pattern evaluation system according to claim 1, wherein
the computer subsystem calculates a feature amount of a signal waveform of an ideal pattern by a simulation based upon design data of the ideal pattern, and further executes a process of setting the calculated feature amount as the reference value.

7. The pattern evaluation system according to claim 1, wherein
the computer subsystem further executes:
a process of respectively extracting signal waveforms from images at a plurality of measurement points of the sample;
a process of calculating a feature amount in a predetermined region for each of the signal waveforms; and
a process of calculating an average value of the plurality of feature amounts, and setting the feature amount closest to the average value as the reference value.

8. The pattern evaluation system according to claim 1, wherein
the computer subsystem further executes a process of setting the feature amount of the signal waveform at a place where the property of the pattern is known as the reference value.

9. The pattern evaluation system according to claim 1, wherein
the computer subsystem further executes:
a process of obtaining a plurality of comparison results by comparing the feature amount and the reference value with respect to a plurality of measurement points of the sample; and
a process of specifying a place where the property of the pattern is changed in the sample from the plurality of comparison results.

10. The pattern evaluation system according to claim 1, wherein
the computer subsystem further executes a process of determining whether the pattern satisfies a manufacturing specification based upon the comparison result between the feature amount and the reference value.

11. A pattern evaluation system according to claim 1, further comprising
a charged particle beam emission subsystem controlled by the computer subsystem, wherein
the charged particle beam emission subsystem includes:
a charged particle source that irradiates the sample with a charged particle beam;
a deflector that deflects the charged particle beam and scans the sample; and
a detector that detects an emitted particle emitted from the sample by emission of the charged particle beam, and
the computer subsystem further executes a process of generating the image based upon a detection signal of the detector.

12. The pattern evaluation system according to claim 11, wherein
the sample includes a plurality of the patterns arranged in a depth direction,
the charged particle beam emission subsystem irradiates a region including the plurality of patterns with the charged particle beam by using the charged particle source and the deflector, and detects the emitted particle from the region by using the detector, and
the computer subsystem executes a process of generating the image based upon the detection signal of the detector and a process of evaluating properties of the plurality of patterns.

13. The pattern evaluation system according to claim 11, wherein
the sample includes a plurality of the patterns arranged in a depth direction,
the computer subsystem further executes:
a process of generating a first image based upon a detection signal obtained by irradiating the sample with the charged particle beam at a first acceleration voltage, and extracting a first signal waveform from the first image;
a process of generating a second image based upon a detection signal obtained by irradiating the sample with the charged particle beam at a second acceleration voltage, and extracting a second signal waveform from the second image; and
a process of acquiring a third signal waveform which is a difference between the first signal waveform and the second signal waveform,
in the process of calculating the feature amount, a feature amount in a predetermined region of the third signal waveform is calculated,
in the comparison process, the feature amount of the third signal waveform is compared with the reference value, and
in the process of evaluating the property of the pattern, the property of the pattern at a predetermined position in the depth direction is evaluated.

14. The pattern evaluation system according to claim 11, further comprising:
a deposition device that forms a metal film on a surface of the sample.

15. The pattern evaluation system according to claim 11, wherein
the pattern is a hole pattern provided in the sample, and
the system further includes a filling device that fills the hole pattern with a first material.

16. A pattern evaluation method, comprising:
obtaining an image of a sample in which a pattern is formed;
extracting a signal waveform of the image;
calculating a feature amount in a predetermined region of the signal waveform; and evaluating a property of the pattern by comparing the feature amount with a reference value of the feature amount,
wherein the reference value is the feature amount of the signal waveform of the pattern in which a plurality of patterns are embedded with respect to a surface of the sample, or the pattern which is formed in a depth direction with respect to the surface of the sample.

17. The pattern evaluation system according to claim 1, wherein the pattern formed inside the sample is a lower part of the plurality of patterns embedded with respect to a surface of the sample, or a lower part thereof along the depth direction with respect to the surface of the sample, and
the plurality of patterns overlap when seen from a Z axis direction perpendicular to an X axis and a Y axis parallel to the surface of the sample.

18. The pattern evaluation system according to claim 1, wherein the pattern formed in the depth direction with respect to the surface of the sample is a hole pattern, a protrusion pattern, or a hole pattern filled with a first material.

\* \* \* \* \*